(12) United States Patent
Lesso et al.

(10) Patent No.: US 8,279,012 B2
(45) Date of Patent: Oct. 2, 2012

(54) AMPLIFIER CIRCUIT AND METHODS OF OPERATION THEREOF

(75) Inventors: John P. Lesso, Edinburgh (GB); John L. Pennock, Midlothian (GB); Peter J. Frith, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 0 days.

(21) Appl. No.: 12/966,248

(22) Filed: Dec. 13, 2010

(65) Prior Publication Data

US 2011/0115563 A1 May 19, 2011

Related U.S. Application Data

(63) Continuation of application No. 12/759,900, filed on Apr. 14, 2010, which is a continuation of application No. 12/434,424, filed on May 1, 2009, now abandoned, which is a continuation of application No. 12/000,549, filed on Dec. 13, 2007, now Pat. No. 7,714,660.

(30) Foreign Application Priority Data

Dec. 22, 2006 (GB) .................................. 0625955.0

(51) Int. Cl.
*H03F 3/04* (2006.01)
(52) U.S. Cl. ........................................ 330/297; 327/536
(58) Field of Classification Search .................. 330/297, 330/127, 129, 134, 279; 327/536; 381/120
See application file for complete search history.

(56) References Cited

U.S. PATENT DOCUMENTS

| | | | |
|---|---|---|---|
| 3,772,606 A | 11/1973 | Waehner | |
| 4,054,843 A | 10/1977 | Hamada et al. | |
| 4,115,739 A | 9/1978 | Sano et al. | |
| 4,409,559 A | 10/1983 | Amada et al. | |
| 4,430,625 A | 2/1984 | Yokoyama et al. | |
| 4,484,150 A | 11/1984 | Carver | |
| 4,507,619 A | 3/1985 | Dijkstra et al. | |
| 5,075,643 A | 12/1991 | Einbinder | |
| 5,200,711 A | 4/1993 | Andersson et al. | |

(Continued)

FOREIGN PATENT DOCUMENTS

EP     0 585 925 A2     3/1994

(Continued)

OTHER PUBLICATIONS

Linear Technologies LTC 1983-3/LTC 1983-5 "100mA Regulated Charge-Pump Inverters in ThinSOT" Technical Description, pp. 1-12.

(Continued)

*Primary Examiner* — Hieu Nguyen
(74) *Attorney, Agent, or Firm* — Dickstein Shapiro LLP

(57) ABSTRACT

A signal amplifying circuit and associated methods and apparatuses, the circuit comprising: a signal path extending from an input terminal to an output terminal, a gain controller arranged to control the gain applied along the signal path in response to a control signal; an output stage within the signal path for generating the output signal, the output stage having a gain that is substantially independent of its supply voltage, and a variable voltage power supply comprising a charge pump for providing positive and negative output voltages, the charge pump comprising a network of switches that is operable in a number of different states and a controller for operating the switches in a sequence of the states so as to generate positive and negative output voltages together spanning a voltage approximately equal to the input voltage.

15 Claims, 28 Drawing Sheets

U.S. PATENT DOCUMENTS

| | | |
|---|---|---|
| 5,289,137 A | 2/1994 | Nodar et al. |
| 5,442,317 A | 8/1995 | Stengel |
| 5,532,916 A | 7/1996 | Tamagawa et al. |
| 5,760,637 A | 6/1998 | Wong et al. |
| 5,898,340 A | 4/1999 | Chatterjee et al. |
| 6,084,789 A | 7/2000 | Van Lieshout |
| 6,166,605 A | 12/2000 | Carver |
| 6,236,273 B1 | 5/2001 | Lewyn |
| 6,329,800 B1 | 12/2001 | May |
| 6,373,340 B1 | 4/2002 | Shashoua et al. |
| 6,825,726 B2 | 11/2004 | French et al. |
| 6,828,845 B2 | 12/2004 | Pennock et al. |
| 7,030,699 B2 | 4/2006 | Richard et al. |
| 7,167,054 B1 | 1/2007 | Dening et al. |
| 7,183,857 B2 | 2/2007 | Doy et al. |
| 7,202,745 B2 | 4/2007 | Kuribayashi |
| 2004/0246050 A1 | 12/2004 | Kikuchi |
| 2005/0285682 A1 | 12/2005 | Lee et al. |
| 2008/0044041 A1 | 2/2008 | Tucker et al. |
| 2008/0150619 A1 | 6/2008 | Lesso et al. |
| 2008/0150620 A1 | 6/2008 | Lesso |
| 2008/0150621 A1 | 6/2008 | Lesso et al. |
| 2008/0159567 A1 | 7/2008 | Lesso et al. |
| 2008/0174372 A1 | 7/2008 | Tucker et al. |
| 2009/0154733 A1 | 6/2009 | Lesso et al. |
| 2009/0212859 A1 | 8/2009 | Lesso et al. |

FOREIGN PATENT DOCUMENTS

| | | |
|---|---|---|
| EP | 1 569 330 A1 | 8/2005 |
| GB | 2 418 792 A1 | 4/2006 |
| JP | 7-240636 A | 9/1995 |
| JP | 8-191224 A | 7/1996 |
| JP | 2001-185960 A | 7/2001 |
| JP | 2002-198750 A | 7/2002 |
| JP | 2005-260581 A | 9/2005 |
| WO | WO-01/78248 A1 | 10/2001 |
| WO | WO-03/096520 A2 | 11/2003 |
| WO | WO-2004/019485 A1 | 3/2004 |
| WO | WO-2005/101627 A1 | 10/2005 |
| WO | WO-2006/031304 A2 | 3/2006 |

OTHER PUBLICATIONS

"Dual Power JFET-Input Operational Amplifier With Switched-Capacitor Voltage Converter", TLE2662, Texas Instruments, pp. 1, 2, 10, 25 (1994).

"Design Trade Offs for Single-Supply Op Amps", Dallas Semiconductor MAXIM Application Note 656.

AMPLIFIER CIRCUIT AND METHODS OF OPERATION THEREOF

This application is a continuation of application Ser. No. 12/759,900, filed Apr. 14, 2010, which is a continuation of application Ser. No. 12/434,424, filed May 1, 2009, now abandoned, which is a continuation of application Ser. No. 12/000,549, filed Dec. 13, 2007, now U.S. Pat. No. 7,714,660, the entire disclosures of which are incorporated herein by reference in their entireties.

The present invention relates to circuitry for improving the efficiency of an amplifier. The invention further relates to a method for improving the efficiency of an amplifying circuit.

When receiving information signals, such as audio signals for example, for outputting to one or more transducers, such as a speaker for example, the information signals generally need to be adjusted in amplitude. One method of achieving this adjustment includes using a control signal, an example of such a signal being a gain control signal, which varies the gain, and thus the amplitude, of the information signal prior to outputting to the transducer.

FIG. 1 illustrates an example of a known amplifier 10.

The amplifier 10 comprises a gain controller 20; an output stage 40; and a power supply 60.

The gain controller 20 receives an input information signal S1 and an input control signal S2. The control signal S2 controls the gain controller 20 that outputs a gain controlled information signal S3 which is fed as an input signal into the output stage 40. The output stage 40 outputs an output signal S4 that is used to drive a load 70.

The output stage 40 and the gain controller 20 are supplied by the power supply 60 which takes power from some external power source and supplies dual, fixed level, supply voltages +V1 and −V1.

The amplitude of the output signal S4 that drives the load 70 is varied i.e. amplified or attenuated, in response to the control input signal S2, by the combined gain of the gain controller 20 and output stage 40.

The power efficiency of the amplifier 10, i.e. the ratio of the power delivered to the load to the power taken from the power source, is an important parameter of the amplifier. It impacts both power consumption, which is important in battery-powered systems for example, and power dissipation, which influences cost in terms of heatsinking for example.

There are thus advantages in methods and circuits for improving the efficiency of amplifiers such as amplifier 10.

In a first aspect of the invention there is provided a signal amplifying circuit comprising:

A main input terminal for receiving an input signal;
A main output terminal for outputting an output signal;
a signal path extending from the main input terminal to the main output terminal;
a gain controller arranged to control the gain applied along the signal path in response to a control signal;
an output stage within the signal path for generating the output signal, the output stage having a gain that is substantially independent of its supply voltage,
a variable voltage power supply comprising a charge pump circuit for providing a plurality of output voltages, the charge pump circuit comprising:
  an supply input terminal and a common terminal for connection to an input voltage,
  first and second supply output terminals for outputting the plurality of output voltages, the supply output terminals in use being connected to the common terminal via respective first and second reservoir capacitors,
  first and second flying capacitor terminals for connection to a flying capacitor,
  a network of switches that is operable in a plurality of different states for interconnecting the terminals, and
  a controller for operating the switches in a sequence of the states, the sequence being adapted repeatedly to transfer packets of charge from the supply input terminal to the reservoir capacitors via the flying capacitor depending on the state, and thereby generating positive and negative output voltages together spanning a voltage approximately equal to the input voltage, and centered on the voltage at the common terminal.
wherein the variable voltage power supply is arranged to vary a supply voltage of the output stage in response to the control signal.

The variable voltage power supply may comprise an input selector for selecting a signal to be input into the input supply terminal of the charge pump circuit, depending on a signal derived from the control signal, therefore controlling the voltage levels at the first and second supply output terminals of the variable voltage power supply. The switch network may be operable in at least a first state and a second state, the controller being adapted to operate the switches in a sequence which interleaves repetitions of the first and second states, the first state being effective to divide the input voltage between the flying capacitor and first reservoir capacitor in series, the second state being effective to apply the flying capacitor's portion of the divided voltage across the second reservoir capacitor. In the first state, the first and second flying capacitor terminals may be connected to the supply input terminal and the first supply output terminal respectively, and in the second state the first and second flying capacitor terminals may be connected to the common terminal and the second supply output terminal respectively.

The switch network may be further operable in a third state effective to apply the flying capacitor's portion of the divided voltage across the first reservoir capacitor, and wherein the controller may be adapted to include repetitions of the third state within the sequence. In the third state, the first and second flying capacitor terminals may be connected to the first supply output terminal and the common terminal respectively. The controller may be adapted to include the third state less frequently than the first and second states.

The switch network may be operable in at least a fourth state and a fifth state, the fourth state being effective to charge up the flying capacitor to the input voltage, the fifth state being effective to divide the voltage on the flying capacitor between the first reservoir capacitor and second reservoir capacitor in series, and wherein the controller may be adapted to operate the switches in a sequence which interleaves repetitions of the fourth and fifth states. In the fourth state, the first and second flying capacitor terminals may be connected to the supply input terminal and the common terminal respectively, and in the fifth state, the first and second flying capacitor terminals may be connected to the first supply output terminal and the second supply output terminal respectively.

The switch network may be operable to connect the first flying capacitor terminal independently to any of the supply input terminal, the first supply output terminal and the common terminal.

The switch network may be operable to connect the second flying capacitor terminal independently to any of the first supply output terminal, the common terminal and the second supply output terminal.

The switch network may comprise:
a first switch for connecting the supply input terminal to the first flying capacitor terminal,
a second switch for connecting the first flying capacitor terminal to the first supply output terminal,
a third switch for connecting the first flying capacitor terminal to the common terminal,
a fourth switch for connecting the second flying capacitor terminal to the first supply output terminal,
a fifth switch for connecting the second flying capacitor terminal to the common terminal, and
a sixth switch for connecting the second flying capacitor terminal to the second supply output terminal.

The controller may be operable to control the network to generate the split rail supply with positive and negative output voltages together spanning a voltage approximately equal to the input voltage, and centered on the voltage at the common terminal when it may be operating in a first mode, the circuit being further operable in a second mode to yield positive and negative output voltages each up to substantially the input voltage across the intermediate supply terminals.

The variable voltage power supply may vary the supply voltage of the output stage by having the charge pump circuit switch between the first mode and the second mode in response to the control signal.

The controller may be adapted in the second mode to operate the switches in a sequence which interleaves repetitions of at least second and sixth states, the sixth state being effective to charge the flying capacitor and the first reservoir capacitor substantially to the input voltage, the second state being effective to transfer the voltage from the flying capacitor to the second reservoir capacitor. In the second state, the first and second flying capacitor terminals may be connected to the common terminal and the second supply output terminal respectively, and in the sixth state the first flying capacitor terminal may be connected to both the supply input terminal and the first supply output terminal and the second flying capacitor terminal may be connected to the common terminal.

The controller may be adapted in the second mode to include in the sequence repetitions a seventh state, the seventh state being effective to charge the flying capacitor independent of either reservoir capacitor. In the seventh state the first flying capacitor terminal may be connected to the supply input terminal only and the second flying capacitor terminal may be connected to the common terminal.

The network may include a switch which may be used in the second mode to connect the supply input terminal to the first supply output terminal independently of the first flying capacitor terminal. The switch may be always closed when the circuit is operating in a particular implementation of the second mode, thus ensuring that the first reservoir capacitor is always connected between the supply input terminal and the common terminal when operating in this particular implementation.

The controller may be operable to implement the second mode of operation in any of the variants herein described.

The controller may be adapted to vary the sequence of states according to load conditions.

The charge pump circuit may be arranged to operate in a closed loop configuration. The first reservoir capacitor may be charged only when the voltage at the first supply output terminal falls below a first threshold value and the second reservoir capacitor may be charged only when the voltage at the second supply output terminal falls below a second threshold value. Alternatively, the first reservoir capacitor and the second reservoir capacitor may be both charged only when either the voltage at the first supply output terminal falls below a first threshold value or the voltage at the second supply output terminal falls below a second threshold value. The variable voltage power supply further may comprise at least one comparator for comparing the voltage at each of the supply output terminals with at least one reference voltage.

The at least one reference voltage may depend on a signal derived from the control signal therefore controlling the voltage levels at the first and second supply output terminals of the variable voltage power supply.

The variable voltage power supply further may comprise a DC-DC converter, such that the input voltage of the charge pump circuit is derived from the output of the DC-DC converter, and wherein the output of the DC-DC converter depends on a signal derived from the control signal.

The variable voltage power supply may comprise a switch allowing the DC-DC converter to be bypassed and the input voltage of the charge pump circuit to be obtained directly from the input of the DC-DC converter.

The variable voltage power supply further may comprise a linear regulator between the output of the DC-DC converter and the input of the charge pump circuit.

The variable voltage power supply may be arranged to vary the supply voltage of the output stage between a plurality of discrete voltage levels in response to the control signal. Alternatively the variable voltage power supply may be arranged to vary the supply voltage of the output stage in a substantially continuous and corresponding manner in response to the control signal.

The output voltage of the variable voltage power supply minus a predetermined offset may be substantially proportional to the gain in the circuit. The predetermined offset may be substantially constant and independent of the control signal. Alternatively the predetermined offset may be dependent on the control signal.

The variable voltage power supply may be arranged to vary the supply voltage such that reductions in the amplitude of the output signal caused by a variation of the control signal may be not matched by increases in voltage drop within the output stage, or the variable voltage power supply may be arranged to vary the supply voltage such that reductions in the amplitude of the output signal caused by a variation of the control signal may be not matched by increases in power loss within the output stage.

The amplifier circuit may comprise a linear amplifier, for example a class A or class AB amplifier.

The gain controller may comprise a variable gain amplifier that may be in the signal path prior to the output stage and that may be responsive to the control signal.

The gain controller may be comprised in the output stage, the control signal being arranged to control the signal amplitude at the main output terminal by acting directly on the output stage, or the gain controller may include the output stage, the control signal being arranged to control attenuation of a signal fed back from the main output terminal to an input of the output stage.

The amplifying circuit may be of a type adapted for the amplification of audio signals, wherein the control signal may be a volume control signal.

The invention also provides for an audio apparatus, portable audio apparatus, communications apparatus, in-car audio apparatus or headphone amplifier incorporating an amplifier circuit or an output amplifier apparatus as described above.

The invention also provides for electronic apparatus comprising an output transducer and an amplifier circuit or an output amplifier apparatus as described above having its output terminal connected to drive the output transducer as the load.

The invention further provides for an RF transmitter apparatus comprising an amplifier circuit or an output amplifier apparatus as described above having its output stage adapted to drive an antenna as the load.

The invention further provides for a line driver for driving a signal through a transmission line, the line driver incorporating the signal amplifying apparatus as described above adapted for driving a transmission line as the load. The line driver may comprise part of a modem device further comprising a modulator, demodulator and controller.

The invention also provides for a method of amplifying an input signal to generate a gain controlled output signal, the method comprising:

generating a split-rail supply voltage from a single input supply received across a supply input terminal and a common terminal, the split-rail supply being output at first and second supply output terminals connected to the common terminal via respective first and second reservoir capacitors, the method comprising connecting a flying capacitor between different ones of the supply terminals in a sequence of states, so as to transfer packets of charge repeatedly from the input supply to the reservoir capacitors via the flying capacitor and thereby to generate the split rail supply with positive and negative output voltages together spanning a voltage approximately equal to the voltage of the input supply, and centered on the voltage at the common terminal; the method further comprising:

applying the split-rail supply voltage to an output stage of an amplifier circuit;

receiving an input signal on a first amplifier input terminal of the amplifier circuit;

receiving a control signal on a second amplifier input terminal of the amplifier circuit;

applying a gain to the input signal in response to the control signal to produce the gain controlled output signal at an amplifier output terminal of the output stage of the amplifier circuit wherein the gain is independent of the supply voltage of the output stage; and varying the split-rail voltage supply applied to the output stage in response to the control signal.

BRIEF DESCRIPTION OF THE DRAWINGS

Example embodiments of the invention are described hereinafter with reference to the accompanying drawings in which:

FIG. 2b illustrates a signal flow diagram of the first embodiment illustrated in FIG. 2a;

FIG. 3 shows waveforms associated with the embodiment of FIG. 2a;

FIGS. 4(a) to 4(c) show waveform relationships associated with the embodiment of FIG. 2a;

DETAILED DESCRIPTION

Example embodiments of circuitry, apparatus and methods described below primarily concern audio applications. However, it will be appreciated by those skilled in the art that other applications to which the present invention is equally applicable are possible and a few such applicable applications are herein described and illustrated.

Basic Amplifier Design

Figure 2A:
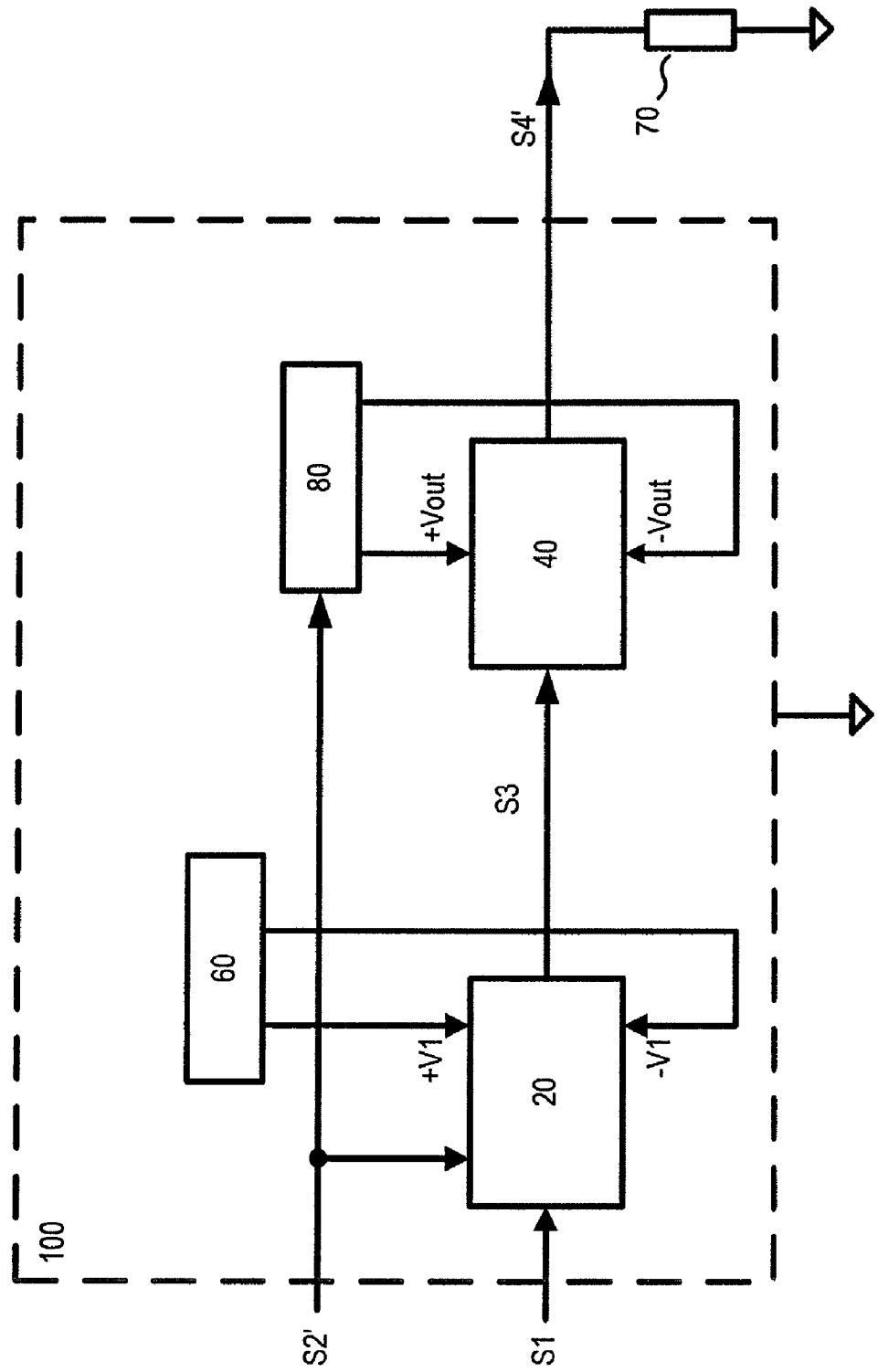
FIG. 2a shows apparatus according to a first embodiment of the invention.

FIG. 2a illustrates an embodiment of a novel amplifier 100 that has been designed to improve the efficiency over devices such as the amplifier 10 described above.

In this particular embodiment, the amplifier 100 comprises: the gain controller 20; the output stage 40 and the power supply 60 as described above. However, amplifier 100 differentiates itself in a first respect from amplifier 10 in that it includes a variable voltage second supply 80 in addition to the fixed voltage first power supply 60.

The gain controller 20 receives an audio input signal S1 and a gain, e.g. a volume, control signal S2'. Amplifier 100 differentiates itself in a second respect from amplifier 10 in that, the control signal S2' has a dual purpose. One such purpose is to control the gain controller 20. The controller 20 outputs a gain controlled signal S3, used as an input signal into the output stage 40 which in turn outputs an output signal S4' that is used to drive a load 70, such as a speaker for example.

The output stage 40 is supplied by the variable voltage power supply 80 which is controlled in response to the control signal S2'. Therefore, the single control signal, S2', has the dual purpose of: (1) controlling the gain controller 20; and (2) controlling the variable voltage power supply 80. It should be noted that the output stage 40 is independent or substantially independent (ignoring power supply rejection issues and the like) of the variable voltage power supply 80. The operational efficiency of the amplifier 100 is affected by the voltage of its supplies and in particular the voltage supplied to the output, i.e. power, stage 40. Therefore, the single control signal, S2', controls both the gain of the amplifier 100 and its operational efficiency, as will be described in more detail below.

Moreover, the variable voltage power supply 80 is operatively arranged in such a way, that the output stage 40 supplies voltages +Vout and −Vout which are varied sufficiently enough in response to the control signal S2' to avoid clipping of the output signal S4'. This will be described in more detail below, The variable voltage power supply 80 receives a supply voltage from a power source (not illustrated), such as, but not necessarily, a fixed voltage first power supply 60. The variable voltage power supply 80 is of a type which includes either a "Level Shifting Charge Pump" or a "Dual Mode Charge Pump" circuit as described later. This charge pump may, in turn, receive its input voltage from a variable voltage DC-DC converter (such as a Buck Converter) either directly or via a linear regulator such as a Low drop out regulator. This allows the charge pump outputs to be varied as required by controlling the DC-DC converter and therefore the input to the charge pump.

By way of one possible illustrative example of how the amplifier 100 may be used and controlled let us assume that the amplifier 100 is an audio amplifier for amplifying an audio input signal S1 wherein: the variable voltage power supply 80 is a Level Shifting Charge Pump circuit; the gain controller 20 and output stage 40 are linear amplifiers, such as class AB amplifiers; the control signal S2' is a volume control signal; and the load 70 is a speaker.

The control signal S2' controls the overall gain of the amplifier 100 in order to change the output volume of the speaker 70. The output volume may be changed in a conventional manner wherein the output volume, i.e. the amplitude of the output signal S4', is varied in response to a volume controller (not illustrated), such as a potentiometer, being manipulated by a user. Therefore, the input signal S1 is scaled by a factor determined by the gain of the amplifier 100 which is controlled in response to the volume control signal S2'.

However, according to the novel amplifier 100, the volume control signal S2' also controls the variable voltage power supply 80. Therefore, the variable voltage power supply 80 produces both positive and negative ground reference supply voltages, respectively +Vout and −Vout, that vary in response to the volume control signal S2'.

It should be noted that In order to prevent the output signal S4' from ever clipping, i.e. distorting, the amplifier 100 should be designed and controlled such that:

$$Vout = |VS4'| + Vx \quad \text{(Equation 1)}$$

where;
  Vout is the magnitude of output voltage of the variable voltage power supply 80;
  |VS4'| is the maximum voltage amplitude of the output signal S4'; and
  Vx is the headroom voltage between output signal S4' and supply voltage Vout that is required by the amplifier output stage 40 to avoid the output signal S4' clipping;

and $$VS4' = VS1max \times G \quad \text{(Equation 2)}$$

where:
  VS1max is a predetermined maximum permissible voltage amplitude of the input signal S; and
  G is the gain of the amplifier 100, as determined by the respective gains of the controller 20 and the output stage 40.

VS1max will generally be predetermined from the design specification of the system, in terms of the maximum input voltage permissible to guarantee avoidance of clipping or to guarantee some other signal distortion specification. In some cases, an application may receive signals larger than the anticipated, i.e. designed, maximum signal and as a result, the output signal may clip or give extra distortion, but performance under such overload conditions is not important. In some cases, for example where the input signal is derived from a digital source or is output from a DAC, there may be a well-defined maximum signal level, set by the word-length or the full-scale reference voltage of the DAC, which the input signal can never exceed.

From Equations 1 & 2, it can be seen that the output voltage Vout of the variable voltage power supply 80 is preferably linearly dependent on the gain G of the amplifier 100 for a given maximum input signal VS1max.

It can be appreciated from the above description that when the volume, i.e. gain, control signal S2' is increased, the output signal S4' amplitude, and hence volume, increases as a result of the increased gain G of the amplifier 100. At the same time, the volume control signal S2' acts upon the variable voltage power supply 80 and changes its output voltages +Vout and −Vout accordingly in response to the control signal S2'. The way that the variable voltage power supply 80 changes the output voltages will become apparent later.

It should be noted that the headroom voltage Vx is preferably kept to a minimum, for a particular design embodiment, so as to minimise the power loss in the amplifier and help maintain overall efficiency.

The variable voltage power supply 80 may be designed such that its output voltages +Vout and −Vout change substantially continuously with the control signal S2'. This may include the possibility of a digital control (not illustrated) with fine resolution. Alternatively, the variable voltage power supply 80 may be designed such that its output voltages +Vout and −Vout change between a plurality of discrete voltage levels as the control signal S2' changes.

Figure 2B:
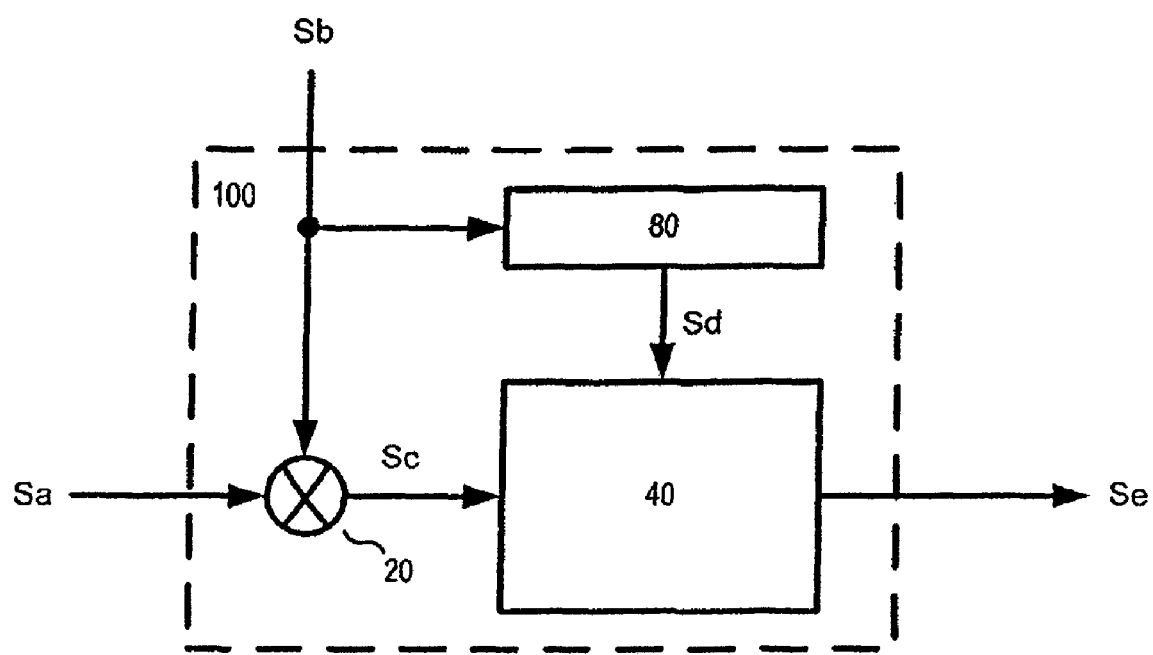

FIG. 2b illustrates a signal flow diagram of the embodiment illustrated in FIG. 2a.

From FIG. 2b it can be seen that signal Sc is a function of signals Sa and Sb; signal Sd is a function of signal Sb; and signal Se is a function of only signal Sc since signal Se is independent, or substantially independent, of signal Sd, wherein: signal Sa represents the input signal S1; signal Sb represents the control signal S2'; signal Sc represents the gain controlled signal S3; signal Sd represents the voltage signal Vout; and signal Se represents the output signal S4'.

Figure 3:
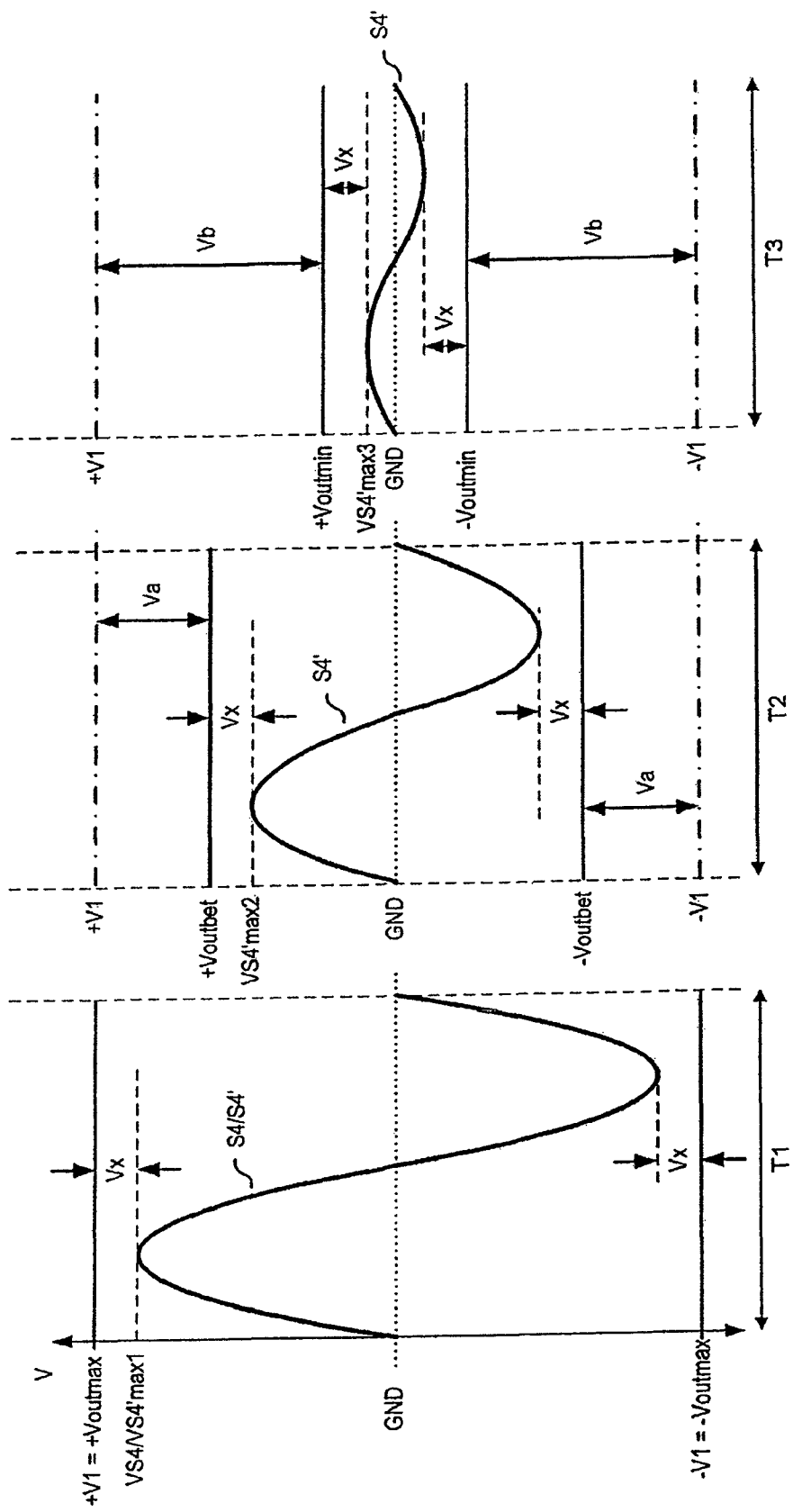

FIG. 3 illustrates a waveform plot of voltage against time for the arrangement of FIG. 2a over a time span during which the volume control signal S2' is reduced.

Period T1 of FIG. 3 represents the amplifier 100 when its control signal S2' is set to its maximum value. It should be noted that during this period the efficiency of both the respective amplifiers 10 and 100 of FIGS. 1 and 2 would be the same, or substantially the same for the same signal conditions, since their respective supply voltages +/−V1 and +/−Vout are equal.

Referring to Period T1 in conjunction with FIG. 2a and considering just the positive excursion of the output signal S4' (since the same equally applies to the negative excursion), the power delivered to the load 70 at the peak voltage VS4'max1 of the output signal S4' is the product of the load current IL1 (not illustrated) and VS4'max1: where IL1=VS4'max1/RL and RL is the resistance of the load 70. The voltage VS4'max1 is specified to allow a certain headroom voltage Vx between the peak output signal voltage VS4'max1 and the supply voltage +Voutmax in order for the correct operation of the output stage 40, where Vx=+Voutmax−VS4max1. The power dissipated by having this headroom voltage Vx is wasted power PW1 which is given by the product of the load current IL1 and Vx. This power PW1 serves no purpose other than to ensure the correct operation, i.e. it avoids distortion through signal clipping, of the output stage 40.

Figure 1:
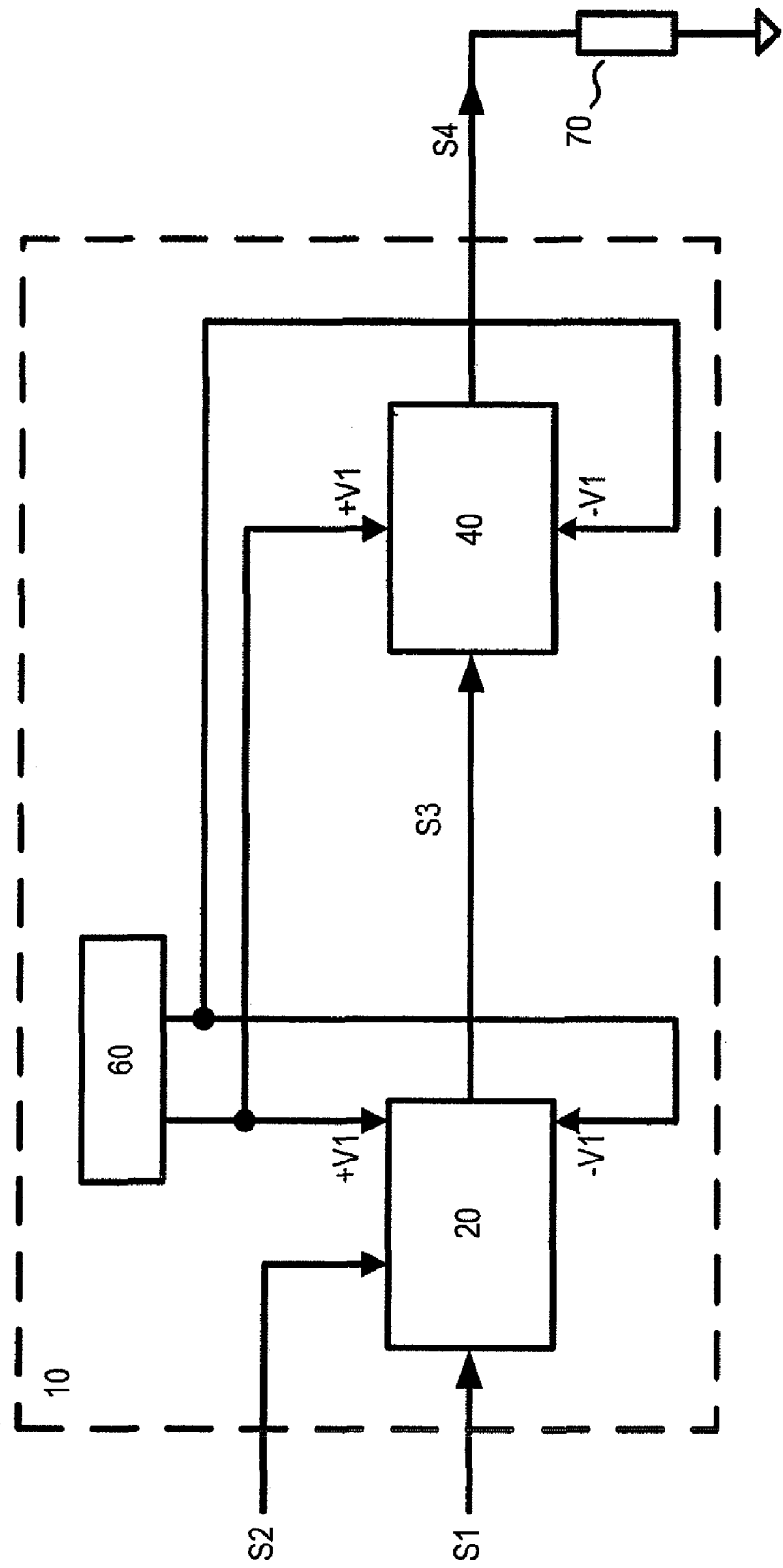
FIG. 1 shows a prior art amplification circuit.

It can be seen that during period T1, where S4' is at or near the maximum signal level that either amplifier 10, 100 can comfortably cope with, the amplifier 100 of FIG. 2a operates in substantially the same way and is therefore no more efficient than the amplifier 10 illustrated in FIG. 1 since under the conditions of period T1 the respective amplifiers 10 and 100, supply voltages +/−V1 and +/−Vout are the same.

Period T2 of FIG. 3 represents the amplifier 100 when its control signal S2' is set to a value between its maximum and minimum values and therefore output signal S4' has a smaller amplitude than during period T1. Unlike for the period T1, the respective efficiencies of the respective amplifiers 10 and 100 of FIGS. 1 and 2 are substantially different since the output voltage of amplifier 10 of FIG. 1 remains, as always, at its fixed level +/−V1, as indicated by the dash-dot lines, whereas the dynamic output voltage +/−Vout of the variable voltage power supply 80 has been adjusted, by the control signal S2', to a new level +/−Voutbet. It can been seen that during this period T2 the efficiency of the amplifier 100 of FIG. 2a has been improved quite substantially over that associated with the amplifier 10 of FIG. 1 as can be deduced from comparing the amplitudes of the voltages Vx and Va during this period T2.

This improvement in efficiency can be seen by referring to Period T2 in conjunction with FIG. 2a, over the positive excursion. The power delivered to the load 70 at the peak voltage VS4'max2 is the product of the load current IL2 (not illustrated) and VS4'max2: where IL2=VS4'max2/RL. Again the power dissipated by having this headroom voltage Vx is wasted power. However, the amplifier 100 during period T2 operates differently to the amplifier 10 of FIG. 1, in having supply rails, at +/−Voutbet, while the supply voltages of amplifier 10 are fixed at +/−V1. Therefore it can be seen that the power PW2 saved by the amplifier 100, over amplifier 10, is given by the product of the load current IL2 and the voltage Va, where Va=V1−Voutbet.

Period T3 of FIG. 3 represents the amplifier 100 when its volume control signal S2' is set to its minimum value, such that the output signal level is very low but possibly still audible. Again, unlike for period T1, during this period T2 the respective efficiencies of the respective amplifiers 10 and 100 of FIGS. 1 and 2 are substantially different since the output voltage of amplifier 10 of FIG. 1 remains at its fixed levels +/−V1, as indicated by the dash-dot lines, whereas the dynamic output voltage +/−Vout of the variable voltage power supply 80 has been adjusted, by the control signal S2', to a new level +/−Voutmin. It can been seen that during this period T3 the efficiency of the amplifier 100 of FIG. 2a has been improved substantially over that associated with the amplifier 10 of FIG. 1 as can be deduced from comparing the amplitudes of the voltages Vx and Vb during this period T3.

The improvement in efficiency is again illustrated by referring to Period T3 in conjunction with FIG. 2a over the positive excursion. The power delivered to the load 70 at the peak voltage VS4'max3 is the product of the load current IL3 (not illustrated) and VS4'max3, where IL3=VS4'max3/RL. As before, the power dissipated by having this headroom voltage Vx is wasted power. However, the amplifier 100 during period T3 operates differently to the amplifier 10 of FIG. 1, in having supply rails at +/−Voutmin, while the supply voltages of amplifier 10 are fixed at +/−V1. Therefore it can be seen that the power PW3' saved by the amplifier 100, over amplifier 10, is given by the product of the load current IL3 and the voltage Vb, where Vb=V1−Voutmin.

Therefore, in general, for periods T2 and T3 the instantaneous power PWi saved by amplifier 100, over amplifier 10, is the product of the instantaneous load current ILi and the voltage difference between V1 and Vou. Over a period of time the average saved power PWa is the product of the average load current ILa and the voltage difference between V1 and Vout.

Therefore, as can be deduced from FIG. 3 in conjunction with FIG. 2a, by adapting i.e. dynamically changing, the supply voltage +/−Vout of the output stage 40 in response to the gain control signal (and therefore effectively the maximum swing of the output signal S4', preferably allowing for a headroom voltage Vx), the efficiency of the output stage 40 and amplifier 100 is improved over that associated with the amplifier 10 of FIG. 1.

It should be noted that in FIG. 3, Vx is illustrated as being constant or substantially constant, however it to may also be possible to further improve the efficiency by allowing Vx to vary with the control signal. For instance a particular output stage may require less headroom when outputting lower output currents, so Vx and hence Vout can be reduced at control input settings related to lower gain settings.

It can therefore be seen that the amplifier 100 of FIG. 2a advantageously reduces losses and improves efficiency when the control signal S2' is used to control the variable voltage power supply 80 so as to control the variation of the supply voltage +Vout/−Vout supplied to the 'power amplifying' output stage 40 in addition to controlling the gain G of the amplifier 100.

Figure 4A:
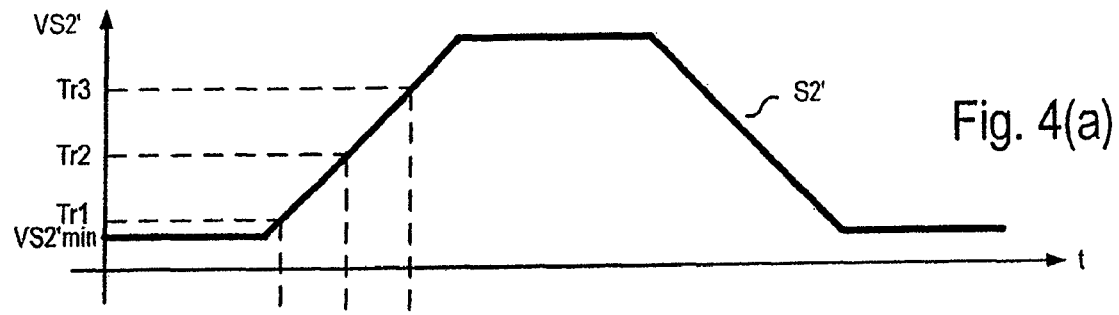
Figure 4B:
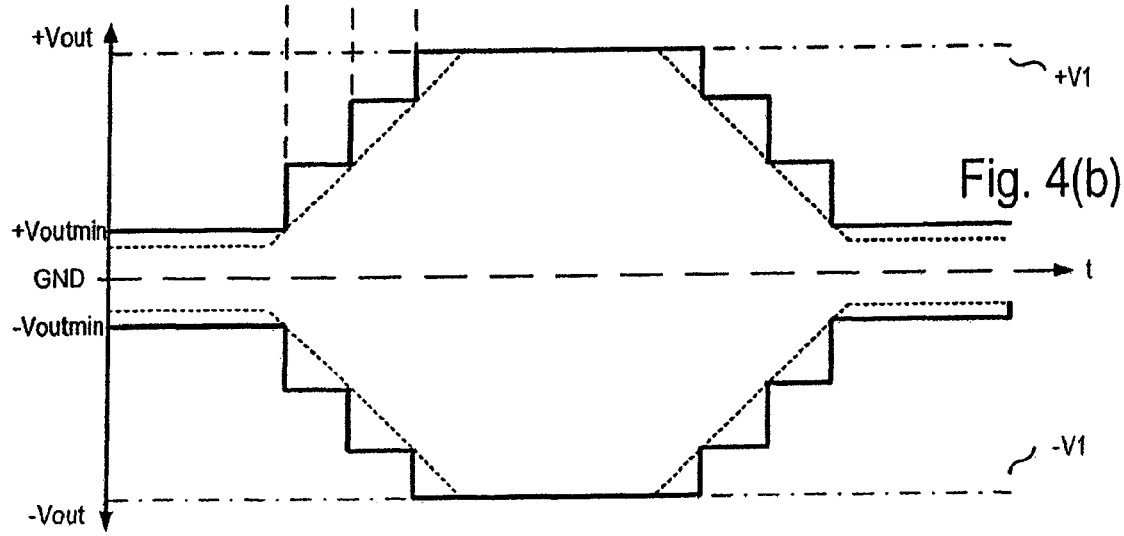
Figure 4C:
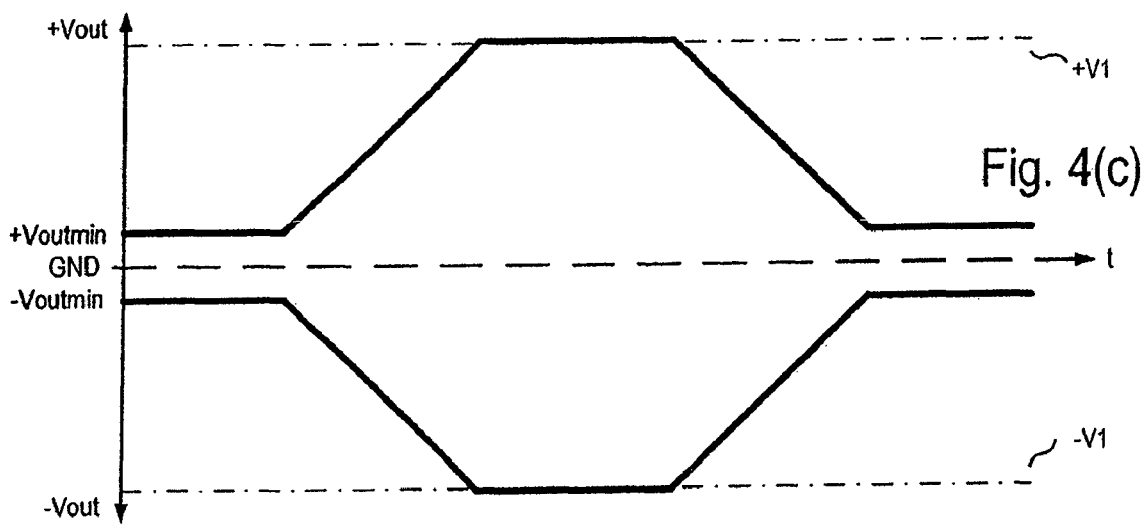

FIGS. 4(a)-4(c) illustrate example relationships between the control signal S2' and the supply voltage to the output stage +/−Vout as the control signal S2' is varied and used for controlling the variable voltage power supply 80 in two different modes.

FIG. 4(a) is an example illustration of the control signal S2' as it is linearly varied from its minimum value to its maximum value, and then sometime later, back down to its minimum value.

FIG. 4(b) illustrates the output voltage +/−Vout variation of the variable voltage power supply 80 for the case where this power supply is designed to only output a plurality of discrete output voltages. This may give a simpler and hence cheaper structure for the variable voltage power supply 80. It may be undesirable from an overall system efficiency point of view to generate intermediate voltages. In this situation, to control the output voltage as a function of the control signal S2', a set of threshold levels is defined as indicated by the references Tr1-Tr3 in FIG. 4(a). Since Vout must always guarantee the headroom Vx above the anticipated maximum output signal swing, yet there are only a few possible levels for Vout, Vout will generally be somewhat larger than the minimum value possible. The dashed line in FIG. 4(b) that tracks the voltages represents the same waveforms as presented in FIG. 4(c) and illustrates the "waste" of voltage, i.e. the inefficiency. So while this 'discrete voltage level' mode is more efficient than that associated with the amplifier 10, it is not as efficient as the mode associated with FIG. 4(c).

FIG. 4(c) illustrates an example variation of the output voltage +/−Vout of the variable voltage power supply 80, as a function of the control signal S2', when the control signal S2' controls the variable voltage power supply 80 such that a variation in the control signal S2' causes a substantially continuous and corresponding variation in the output voltage +/−Vout. In this case the variation in the output voltage +/−Vout follows a variation in the control signal S2'. Vout is controlled so that it tracks the maximum anticipated output swing, with extra headroom Vx.

Many modern amplifiers may have the gain digitally controlled, in which case there will still be discrete levels of the control signal, but so many of them (say 256 for an 8-bit control word), that the resultant supply voltage waveform +/−Vout will substantially be similar to that of FIG. 4c. In such an embodiment, the loss of efficiency, due to the finite resolution in supply voltage +/−Vout, will be small and the supply voltage +/−Vout may be regarded as being varied in a substantially continuous manner.

Also illustrated, for comparison, in FIGS. 4a-4c is a dash-dot line that represents the fixed voltage level +/−V1 associated with the arrangement of FIG. 1.

Variable Voltage Power Supply Design

The variable voltage power supply 80 will now be described. As mentioned previously this power supply includes a charge pump of a novel type referred to as a "Level Shifting Charge Pump" (LSCP) or a variation on this referred to as a "Dual Mode Charge Pump". These charge pump circuits address the problems of conventional charge pump circuits, such as Inverting Charge Pumps, namely, that they can only generate output voltages that have a rail-to-rail magnitude greater than the input voltage. This can be disadvantageous in certain applications, as it may not allow the circuitry being supplied to run efficiently, for example when such an Inverting Charge Pump circuit is being used to power circuitry that amplifies a signal with a maximum amplitude much smaller than the amplifier circuitry's power supply +/−VDD. This means that such an inverting charge pump, should it be used in the Variable Voltage Power Supply 80 for the novel amplifier 100, may be inefficient at particularly low volumes where the appropriate output level of the charge pump for the volume set is somewhat less than its lowest possible input level. Furthermore, should the charge pump receive its input from a DC-DC converter, there would be significant losses in this DC-DC converter should it have to input lower voltages to the charge pump much of the time.

Figure 5A:
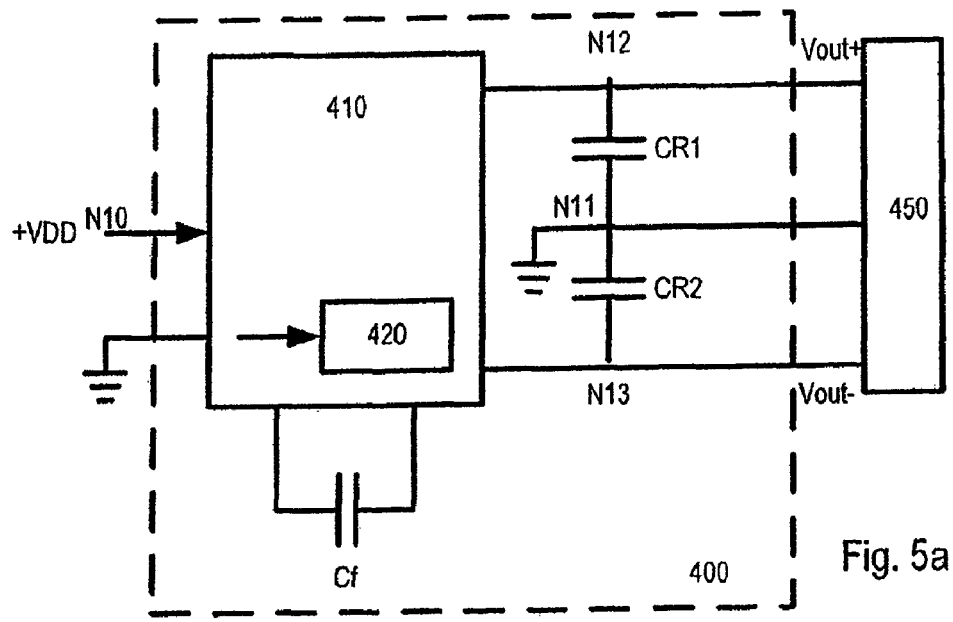
FIG. 5a shows a Level Shifting Charge Pump circuit suitable for use in the variable voltage power supply in any embodiment of the invention.

FIG. 5a is a block diagram of a novel inverting charge pump circuit, which we shall call a "Level Shifting Charge Pump" (LSCP) 400. In this circuit there are two reservoir capacitors CR1 and CR2, a flying capacitor Cf and a switch array 410 controlled by a switch controller 420 (which may be software or hardware implemented) arranged as shown. In comparison to a conventional Inverting Charge Pump, it is notable that reservoir capacitor CR1 is not connected directly to the input supply voltage VDD, but only via the switch array 410.

It should be noted that LSCP 400 is configured as an open-loop charge-pump. Therefore, LSCP 400 relies on the respective loads (not illustrated) connected across each output N12-N11, N13-N11 remaining within predetermined constraints. The LSCP 400 outputs two voltages Vout+, Vout− that are referenced to a common voltage supply (node N11). Connected to the outputs Vout+, Vout−, N11, and shown for illustration only, is a load 450. In reality this load 450 may be wholly or partly located on the same chip as the power supply, or alternatively it may be located off-chip.

LSCP 400 operates such that, for an input voltage +VDD, the LSCP 400 generates outputs each of a magnitude which is a half of the input voltage VDD. In other words, the output voltages generated in this first mode are nominally of magnitude +VDD/2 and −VDD/2. When lightly loaded, these levels will, in reality, be +/−(VDD/2−Iload.Rload), where Iload equals the load current and Rload equals the load resistance. It should be noted that, in this case, the magnitude (VDD) of output voltage across nodes N12 & N13 is the same, or is substantially the same, as that of the input voltage (VDD) across nodes N10 & N11, but shifted.

This particular form of charge pump has significant advantages over known circuits, in particular because of the ability to generated a reduced, bipolar supply using only a single flying capacitor. Prior circuits for generating reduced output voltages requires additional flying capacitors. The flying capacitor and reservoir capacitors are often of a size that they need to be located off-chip, and so eliminating one capacitor and two IC pins is highly beneficial.

Figure 5B:
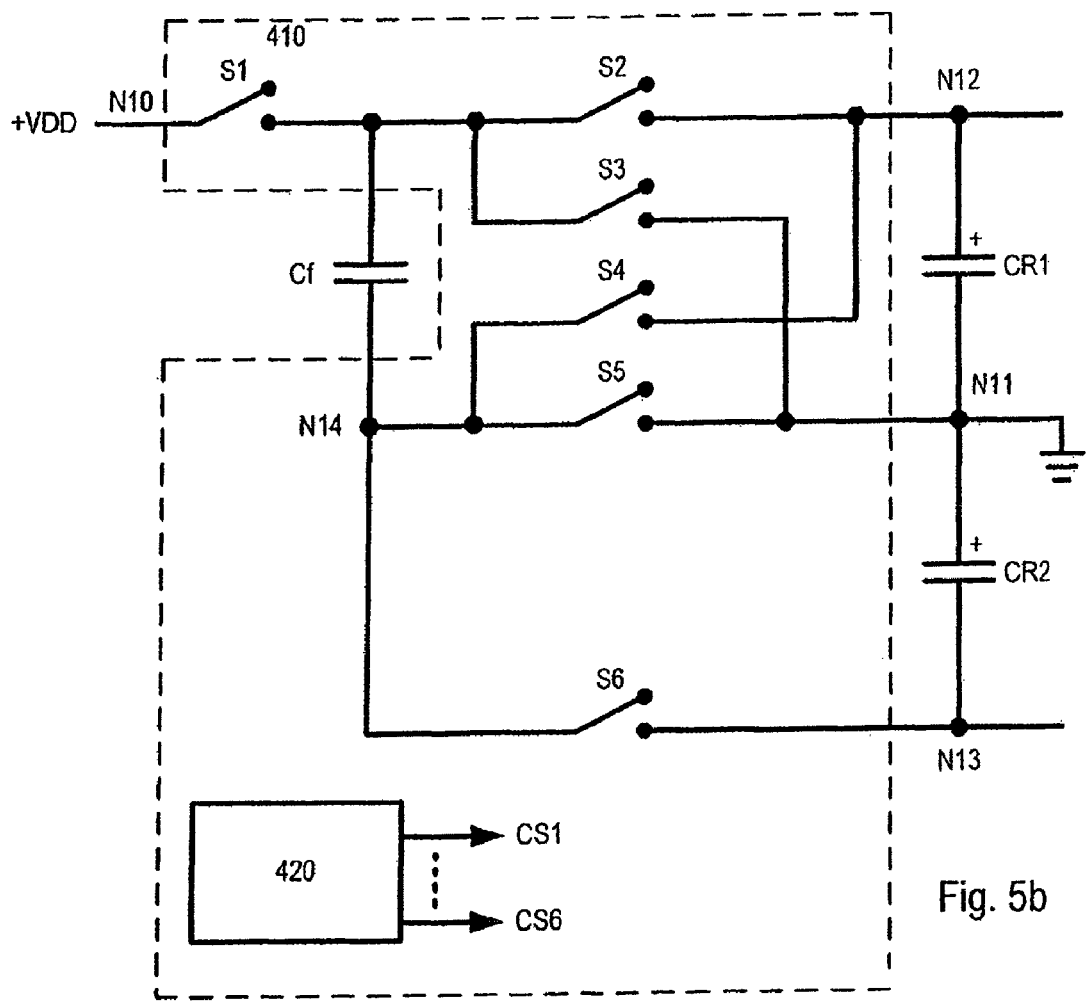
FIG. 5b shows the same circuit as FIG. 4a with detail of the switch array shown.

FIG. 5b shows more internal detail of the LSCP 400 and, in particular, detail of the switch array 410 is shown. The switch array 410 comprises six switches S1-S6 each controlled by corresponding control signal CS1-CS6 from the switch controller 420. The switches are arranged such that first switch S1 is connected between the positive plate of the flying capacitor Cf and the input voltage node N10, the second switch S2 is between the positive plate of the flying capacitor and first output node N12, the third switch S3 is between the positive plate of the flying capacitor and common terminal N11, the fourth switch S4 is between the negative plate of the flying capacitor and first output node N12, the fifth switch S5 is between the negative plate of the flying capacitor and common terminal N11 and the sixth switch S6 is between the negative plate of the flying capacitor and second output terminal N13. Optionally, there may be provided a seventh switch S7 (shown dotted on FIG. 10), connected between the input voltage source (node N10) and first output node N12. These switches are the ones appropriate to operate as described herein. The provision of further switches to enable other modes of operation is of course not excluded.

It should be noted that the switches can be implemented in a number of different ways (for example, MOS transistor switches or MOS transmission gate switches) depending upon, for example, an integrated circuit's process technology or the input and output voltage requirements. The selection of appropriate implementations is well within the capability of the skilled reader.

The LSCP 400 has three basic states of operation repeated in high-frequency cycles of three phases, which may be referred to as P1, P2, P3.

Figure 6A:
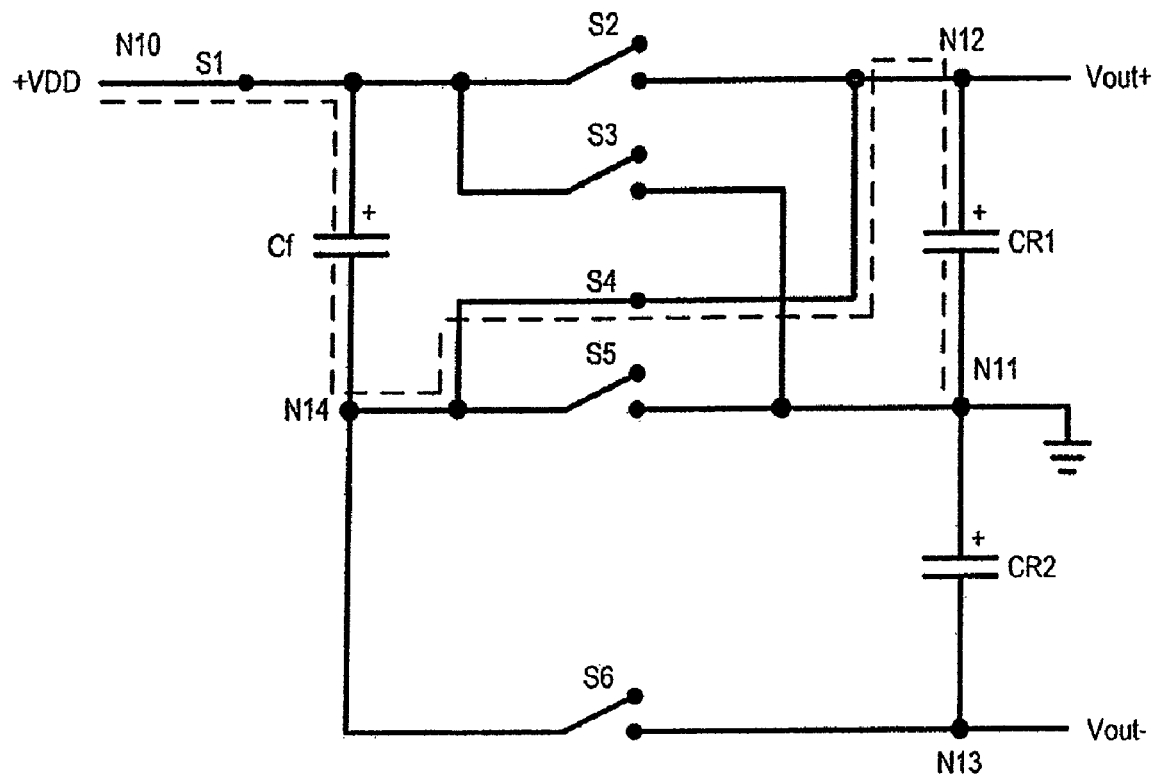
FIGS. 6a and 6b show, respectively, the circuit with the switch array in a first state and an equivalent circuit of this state.
Figure 6B:
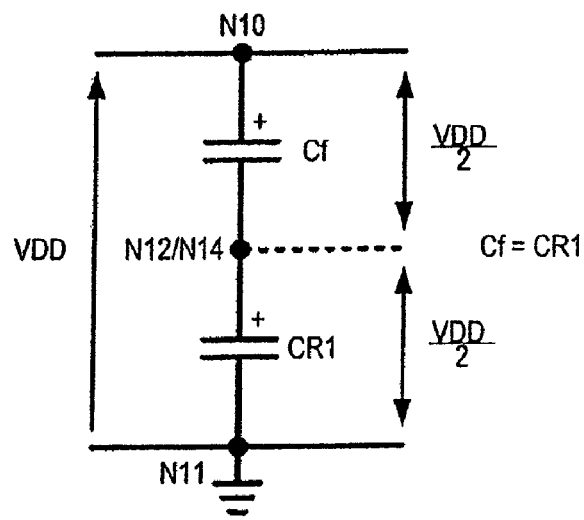

FIGS. 6a and 6b show the switch array 410 operating in a first state, "State 1". Referring to FIG. 6a, switches S1 and S4 are closed such that capacitors Cf and CR1 are connected in series with each other and in parallel with the input voltage +VDD. Therefore, capacitors Cf and CR1 share the input voltage +VDD that is applied across them. FIG. 6b shows an equivalent circuit for the State 1 operation with voltage +VDD effectively applied across nodes N10 & N11.

It is preferable in order to obtain symmetrical, opposite polarity, output voltages, that the values of capacitors Cf and CR1 are equal such that each capacitor Cf, CR1 changes voltage by an equal increment when connected in series across a voltage source. If both capacitors are initially discharged, or indeed previously charged to any equal voltages, they will end up each with a voltage equal to half the applied voltage source, in this case one half of the input voltage VDD.

Figure 7A:
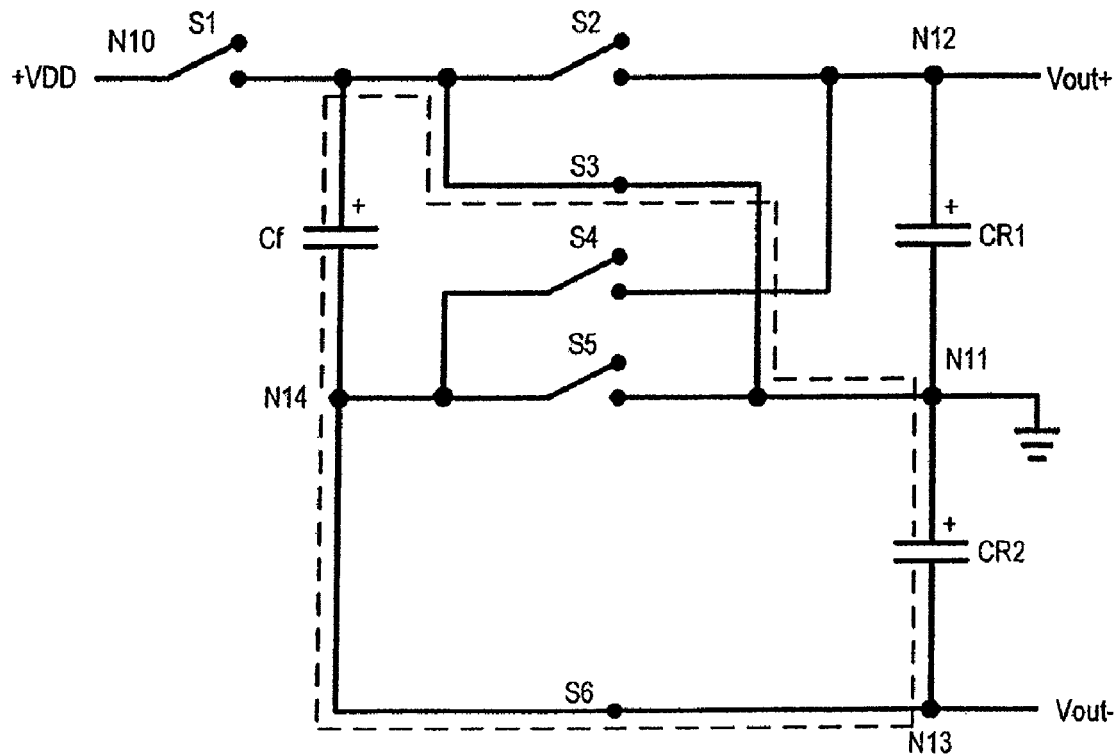
FIGS. 7a and 7b show, respectively, the circuit with the switch array in a second state and an equivalent circuit of this state.
Figure 7B:
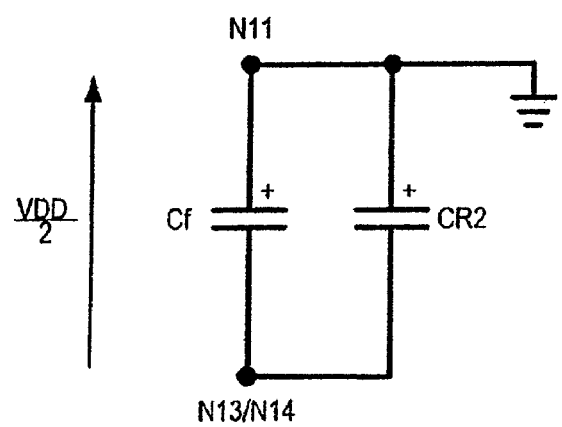

FIGS. 7a and 7b show the switch array 410 operating in a second state, "state 2". Referring to FIG. 7a, switches S3 and S6 are closed such that capacitors Cf and CR2 are connected in parallel with each other and between nodes N11 and N13. Therefore, the voltage across capacitor Cf equalises with that across capacitor CR2. Over a plurality of cycles, the voltages across the capacitors Cf and CR2 will converge to a voltage VDD/2. FIG. 7b shows an equivalent circuit for this state 2 condition.

It should be noted that the value of reservoir capacitor CR2 does not necessarily need to be the same as that of flying capacitor Cf. If capacitor CR2 is much larger than capacitor Cf, it will require more state sequences to charge up to or close to VDD/2. The value of reservoir capacitor CR2 should be chosen depending upon expected load conditions and required operating frequency and output ripple tolerance.

Over a plurality of cycles alternating only States 1 and 2, the voltages across the capacitors Cf and CR2 would, under ideal conditions, converge to a voltage +/−VDD/2. However, the presence of a significant load on the LSCP's 400 output terminals will result in a respective voltage droop in Vout+, Vout− away from +/−VDD. If the load is symmetric, and there is equal current magnitude on both Vout+ and Vout−, then the symmetry of the system will result in both outputs drooping by the same amount.

However, if for example there is a significant load on Vout+ but no'load or a light load on Vout−, then the voltage across capacitor CR1 will reduce. This will result in a larger voltage across capacitor Cf at the end of State 1 which will then be applied to capacitor CR2 in State 2. If only States 1 and 2 were used, the flying capacitor Cf would then be connected in series with capacitor CR1 in State 1 but still having a larger voltage across it, even initially. Therefore, voltages Vout+ and Vout− will both tend to droop negatively, that is to say that the common mode is not controlled.

Figure 8A:
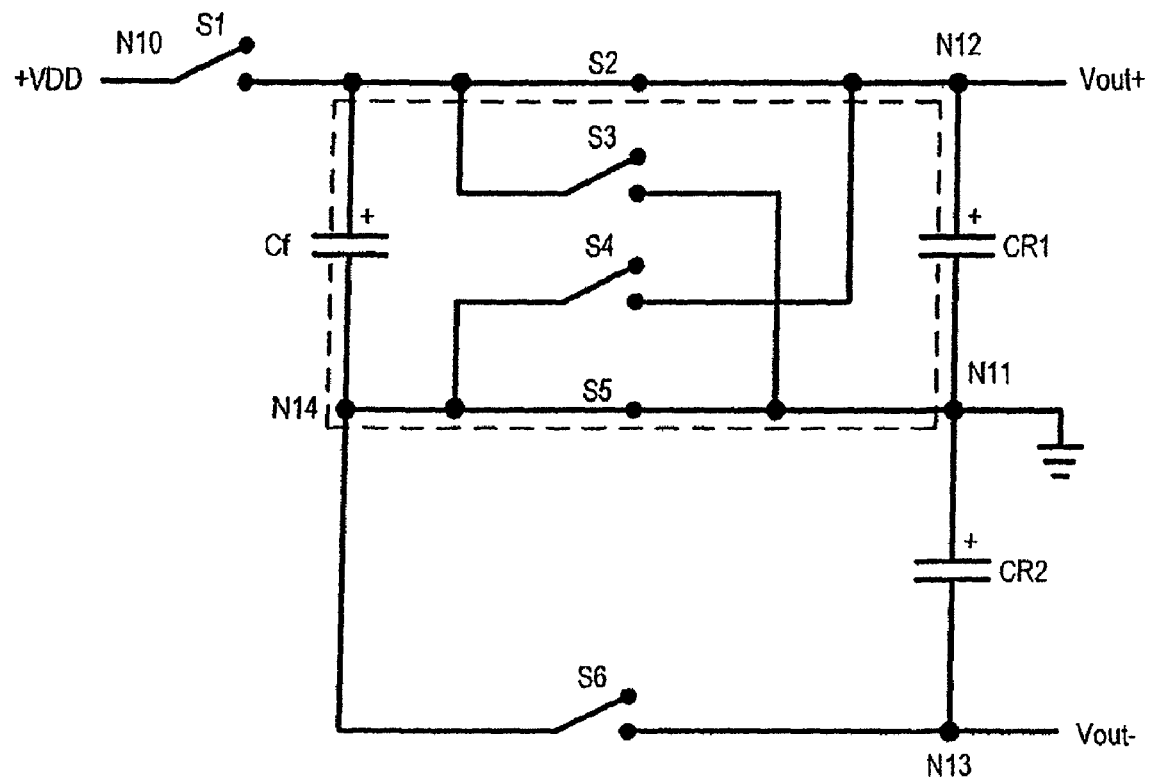
FIGS. 8a and 8b show, respectively, the circuit with the switch array in a third state and an equivalent circuit of this state.
Figure 8B:
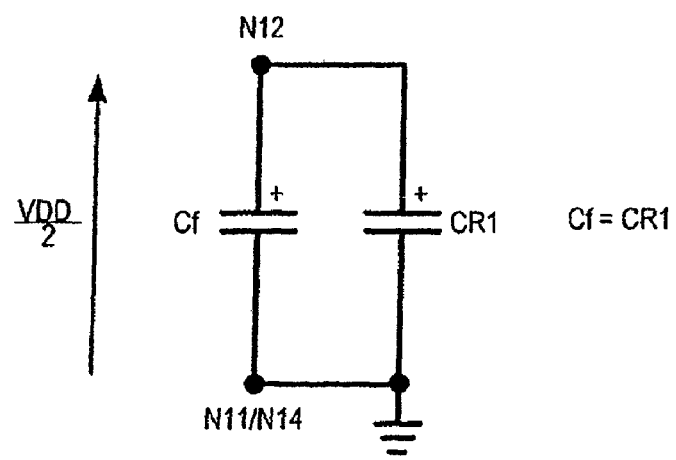

To avoid this effect, a third state, State 3, is introduced and States 1 to 3 are repeated in Phases 1 to 3 over successive cycles. FIGS. 8a and 8b show the switch array 410 operating in this state 3 operation. Referring to FIG. 8a, in state 3, switches S2 and S5 are closed such that capacitors Cf and CR1 are connected in parallel with each other and between nodes N11 and N12. Therefore, both capacitors Cf and CR1 become charged up to an equal voltage, despite any difference between of their previous voltages. In steady state (after many cycles) this becomes approximately VDD/2. FIG. 8b shows an equivalent circuit for this State 3 condition.

The circuit, therefore ends State 3 with equalised voltages, after which it returns to State 1. Consequently the circuit will, in principle, enter Phase 1 of the next cycle in State 1 with Vout+=+VDD/2, depending upon load conditions and switching sequence.

In States 2 and 3, the voltages across the various capacitors that are connected in parallel may not actually, in practice, completely equalise in a single sequence, particularly if the switching frequency is high, relative to the LSCP's R-C time constant. Rather, in each sequence of states a contribution of charge will be passed from capacitor to capacitor. This contribution will bring each output voltage to the desired level under zero, or low, load conditions. Under higher load conditions, the output reservoir capacitors CR1, CR2 will typically achieve a lower voltage (with some ripple). The size of each of the capacitors needs simply to be designed such that the reduction of common mode drift is within acceptable bands for all expected load conditions. Alternatively, or in addition, larger switches, with less on-resistance, could be employed.

Figure 9:
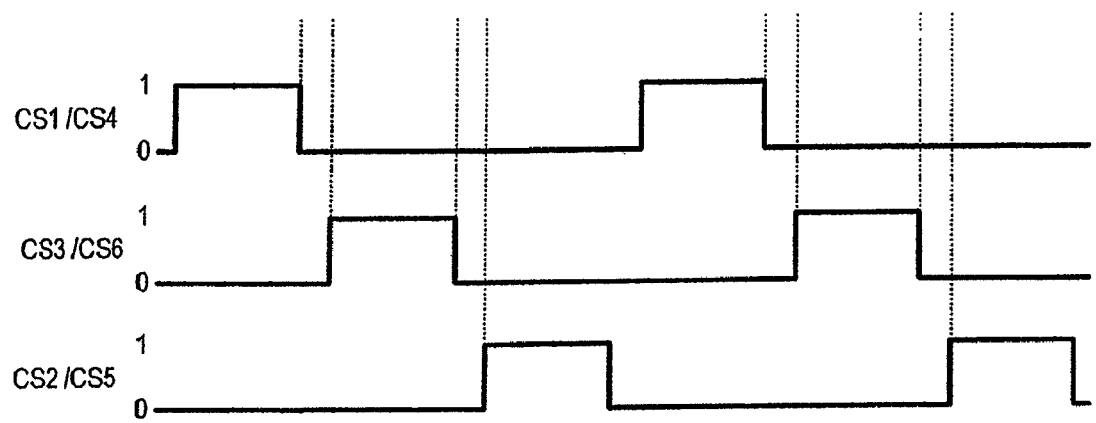
FIG. 9 is a timing diagram showing three switch control signals for the circuit of FIGS. 1 and 2 operating in a first main mode (Mode 1)

FIG. 9 illustrates the non-overlapping control signals (CS1-CS6) for controlling the switches (S1-S6) during the three states (1, 2 and 3) of the main operational embodiment. As discussed above, this represents only one example out of many possibilities for the controlling sequence.

It should be appreciated that the open-loop sequencing of the above three states does not necessarily need to be observed. For example the state sequences could be: 1, 2, 3, 1, 2, 3 . . . (as described above); or 1, 3, 2, 1, 3, 2 . . . ; or 1, 2, 1, 3, 1, 2, 1, 3. It should also be apparent that it is not necessary that the third state be used as often as the other two states, for instance a sequence of 1, 2, 1, 2, 1, 2, 3, 1 can be envisaged. It may even be envisaged to dispense with the third state altogether, albeit only in the case of well-balanced loads, or with alternative schemes for common-mode stabilisation.

Other switching and sequencing scenarios exist. For example, in one alternative operational Mode 1 embodiment: State 1 could be replaced by a fourth state, "State 4" whereby switches S1 and S5 are closed (all other switches are open). In this state capacitor Cf charges up to input voltage +VDD. A fifth state, "State 5" would then operate with switches S2 and S6 closed (all other switches open) such that flying capacitor Cf is connected across reservoir capacitors CR1 and CR2 in series (which, in this scenario, may be equal in capacitance). This particular example of an alternative switching and sequencing scenario has the drawback that there is no common-mode control and therefore such a switching and sequencing scenario would suffer from common-mode drift. However, this common-mode drift can be "reset" by altering the switching sequence at appropriate intervals during the "normal" switching and sequencing cycle. These alterations can be predetermined, or initiated in response to observed conditions.

It should be noted that the sizes of capacitors Cf, CR1, CR2, can be selected to meet the required ripple tolerances (versus size/cost) and consequently the clock phase duration for each state need not necessarily be of ratio 1:1:1.

Figure 26:
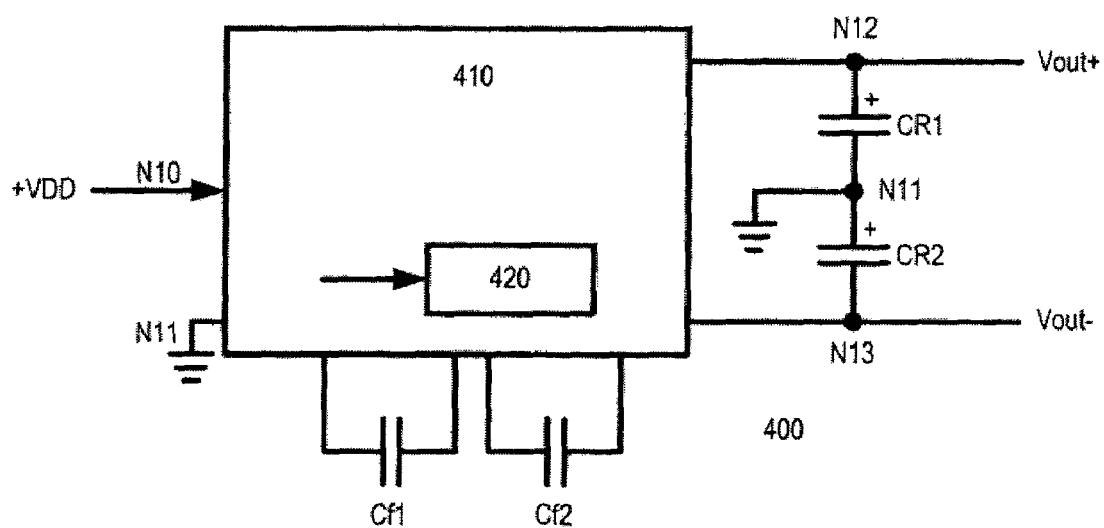

While the above describes an embodiment wherein the LSCP generates outputs of +/−VDD/2, it will be understood by the skilled person that the above teaching could be used to obtain outputs of any fraction of VDD by increasing the number of flying capacitors Cf and altering the switch network accordingly. The relationship between output and input in this case is Vout+/−=+/−VDD/(n+1) where n equals the number of flying capacitors Cf. It will also be appreciated that circuits with more than one flying capacitor as described will still be capable of generating outputs of +/−VDD/2 as well as outputs for every intermediate integer denominator between +/−VDD/2 and +/−VDD/(n+1) depending on its control. For example, a circuit with two flying capacitors can generate outputs of VDD/3 and VDD/2, one with three flying capacitors can generate outputs of VDD/4, VDD/3 and VDD/2 and so on. An example block diagram of an inverting charge pump circuit with n flying capacitors Cf1, Cf2, where n equals two, is illustrated in FIG. 26.

Figure 15:
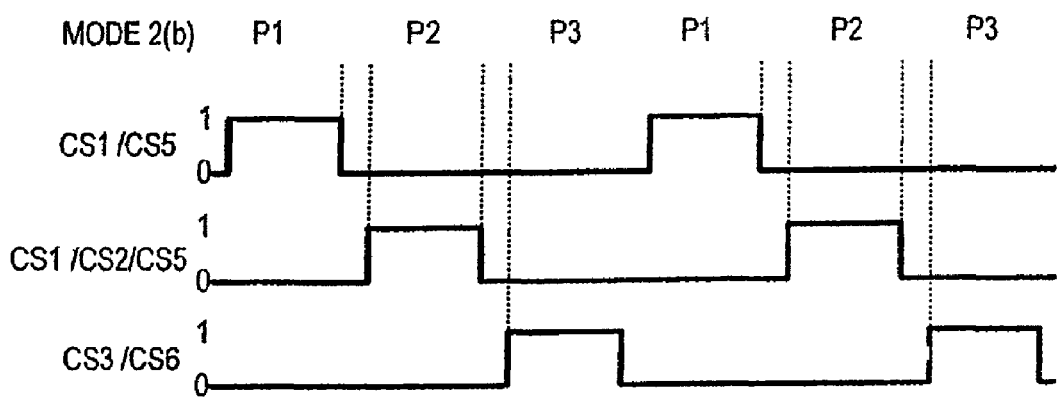
FIGS. 15, 16 and 17 are timing diagrams showing switch control signals in second, third and fourth variants of the second main mode of operation (Mode 2(b), 2(c), 2(d) respectively)

Obviously, in order to operate as a variable voltage power supply, the LSCP needs to have variable outputs. This may be achieved as described in the above paragraph. It may also be achieved by having the input, voltage +VDD alterable in any suitable way, one example being illustrated below with reference to FIGS. 16 and 17. Another way is by making the reference voltage alterable on a LSCP circuit operating in a closed loop configuration as illustrated in FIG. 15. Alternatively, or in addition to these methods, the circuit of FIG. 5a can also be made capable of dual mode operation depending on its controlling circuitry/programming, each mode resulting in different output voltage levels.

Figure 10:
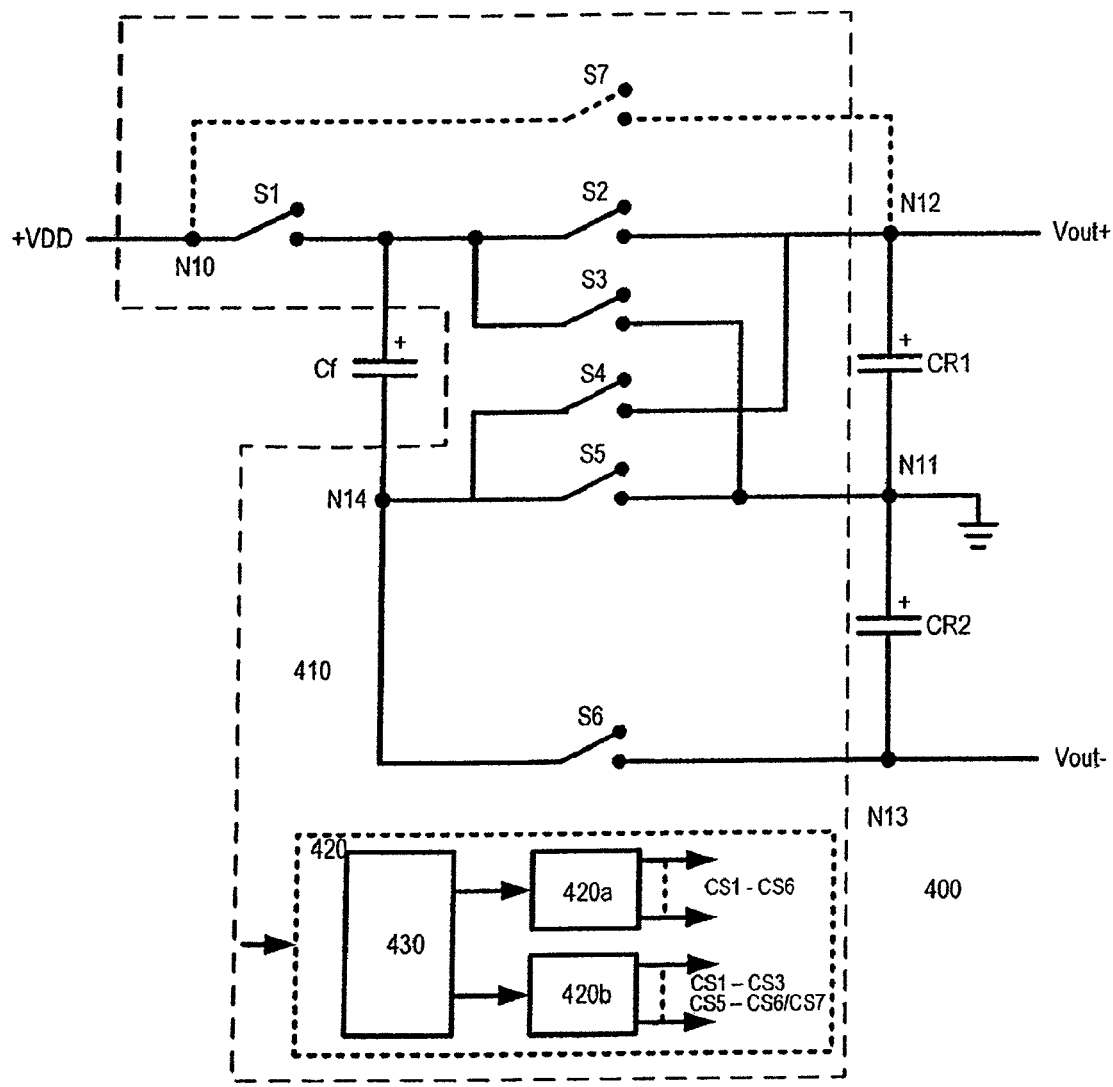
FIG. 10 shows a Dual Mode Charge Pump circuit suitable for use in the variable voltage power supply in any embodiment of the invention.

When the LSCP is configured to be operable in two modes the circuit will be referred to as the Dual-Mode Charge Pump (DMCP). In this embodiment, there is provided a mode select circuit 430 within the control module 420. This a mode select circuit 430, depending on an input control signal Ic, selects one of two switch controller circuits/programs 420a, FIG. 10 shows an alternative embodiment referred to as the Dual-Mode Charge Pump (DMCP) which is operable in two main modes. The charge-pump, in this example configured as an open-loop charge-pump, differs in that there is provided a control module 420 which, at least notionally, comprises mode select circuit 430 for deciding which of two control functions 420a, 420b to use, thus determining which mode the DMCP operates in. The mode select circuit 430 and the controllers 420a, etc. are notional blocks in that they represent different behaviours of the control module in implementing different operating modes of DMCP 400. They can be implemented by separate circuits as just described. In practice, they are just as likely to be implemented by a single circuit block or sequencer with hardwired logic and/or sequencer code determining which behaviour is implemented at a given time. As also described below, where a given mode can be implemented in a range of variants, the designer may select variants which simplify the generation of the control signals, when all the different modes are considered together.

Another optional difference between the LSCP and DMCP is that the switch array 1100 now comprises seven switches S1 to S7. Switches S1 to S6 are arranged as before, while optional switch S7 is connected between the input voltage source and first output node N12.

The DMCP's two main modes are a first mode (Mode 1) where it produces a dual rail output of voltages +/-VDD/2, and a second mode (Mode 2) where it produces a dual rail output of +/-VDD (+VDD again being the input source voltage level at node N10). As before, the circuit can also produce outputs of any voltages up to these levels if arranged to operate in a closed loop configuration.

Furthermore, in Mode 2, the circuit is operable in four sub-Modes, referred to as Modes 2a, 2b, 2c and 2d. Optional switch S7 is only used in Modes 2c and 2d. Consequently, if switch S7 is not included, Mode 2 is only operable in sub-Modes 2a and 2b.

Figure 11A:
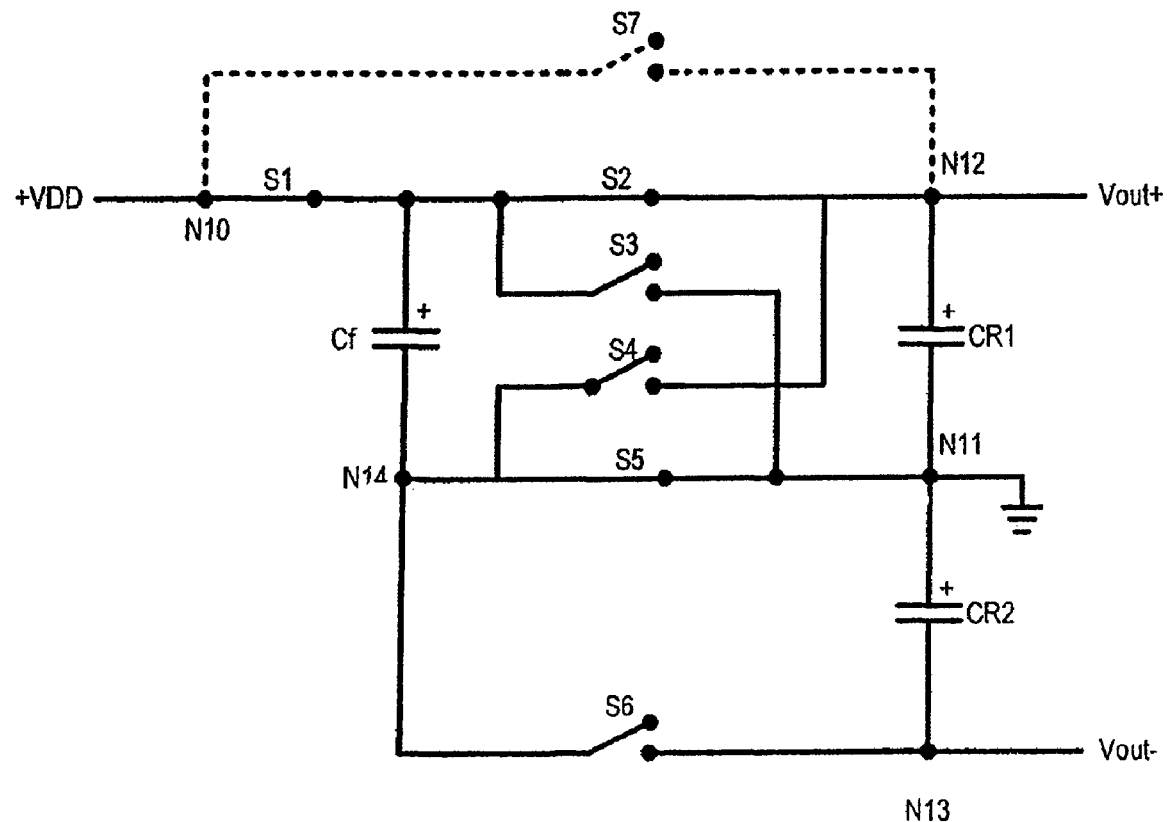
FIGS. 11a and 11b show, respectively, the circuit with the switch array in a sixth state and an equivalent circuit of this state.
Figure 11B:
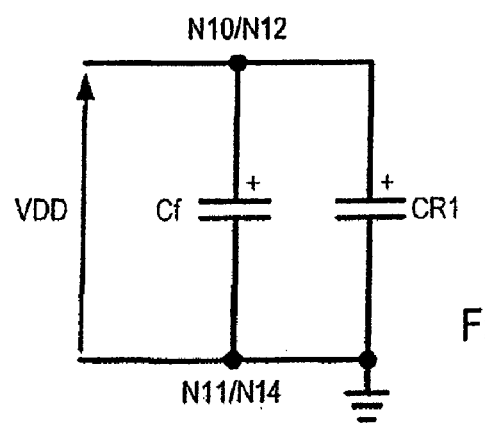

In Mode 2a the DMCP has two basic states of operation. FIG. 11a shows the circuit operating in the first of these states, "State 6". In this state, switches S1, S2 and S5 are closed (S3, S4 and S6 are open). This results in capacitors Cf and CR1 being connected in parallel across the input voltage +VDD, between nodes N10 & N11. Therefore, capacitors Cf and CR1 each store the input voltage +VDD. FIG. 11b shows an equivalent circuit for the State 6 operation.

Figure 12A:
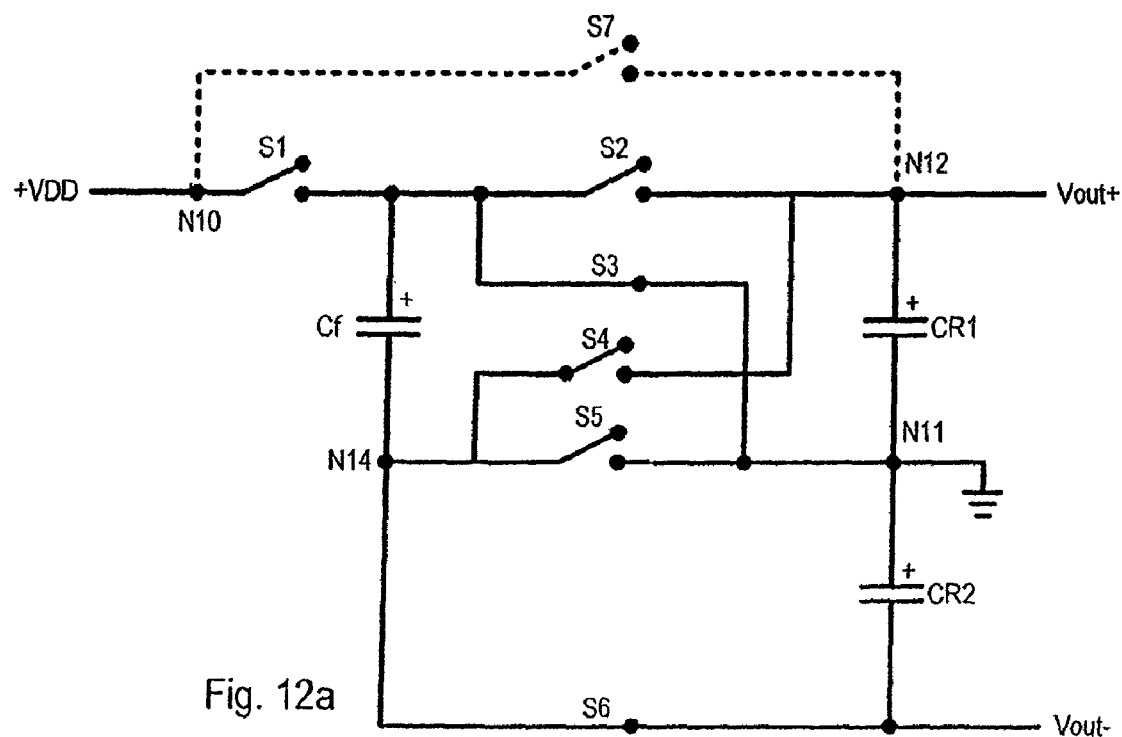
FIGS. 12a and 12b show, respectively, the circuit with the switch array again in the second state and an equivalent circuit of this state.
Figure 12B:
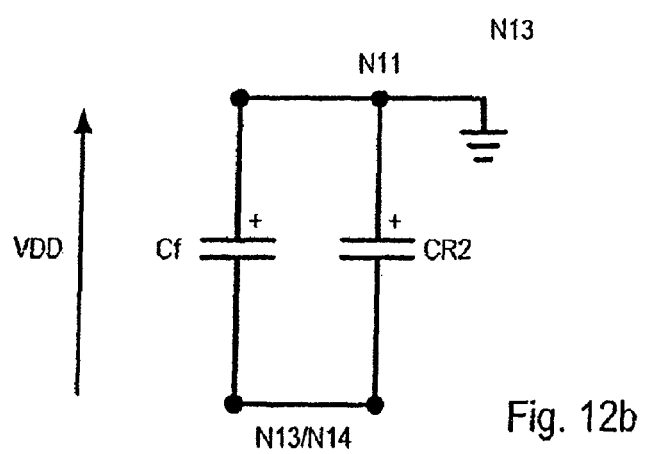

FIG. 12a shows the circuit operating in the second of these states, "State 2", which is, in fact, the same state as state 2 in Mode 1, whereby switches S3 and S6 are closed (S1, S2, S4 and S5 are open). Therefore capacitors Cf and CR2 are connected in parallel between common node N11 and second output node N13. Therefore, capacitors Cf and CR2 share their charge and Node 13 exhibits a voltage of -VDD after a number of state sequences. FIG. 12b shows an equivalent circuit for this State 2 of operation.

Figure 13:
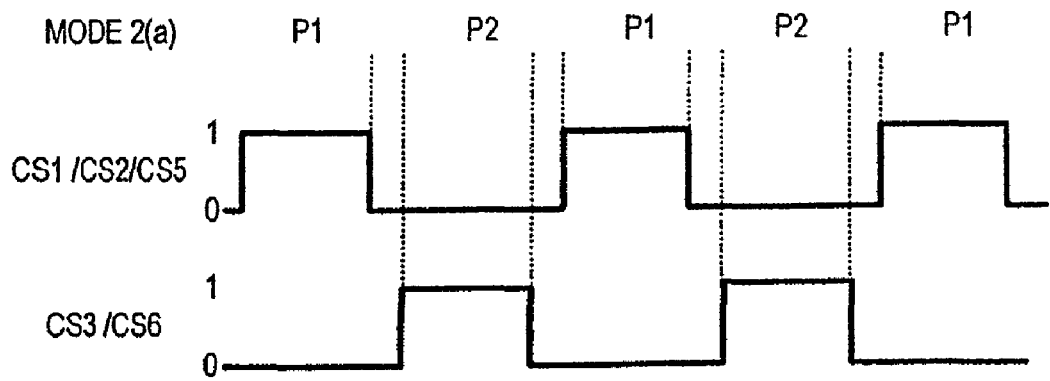
FIG. 13 is a timing diagram showing control signals in a first variant of a second main mode of operation (Mode 2(a))

FIG. 13 illustrates the non-overlapping control signals (CS1-CS3 & CS5-CS6) for controlling the switches (S1-S3 and S5-S6) during the two alternating states of Mode 2(a). The sequence of states in this mode is therefore 6, 2, 6, 2, 6, . . . etc.

Figure 14A:
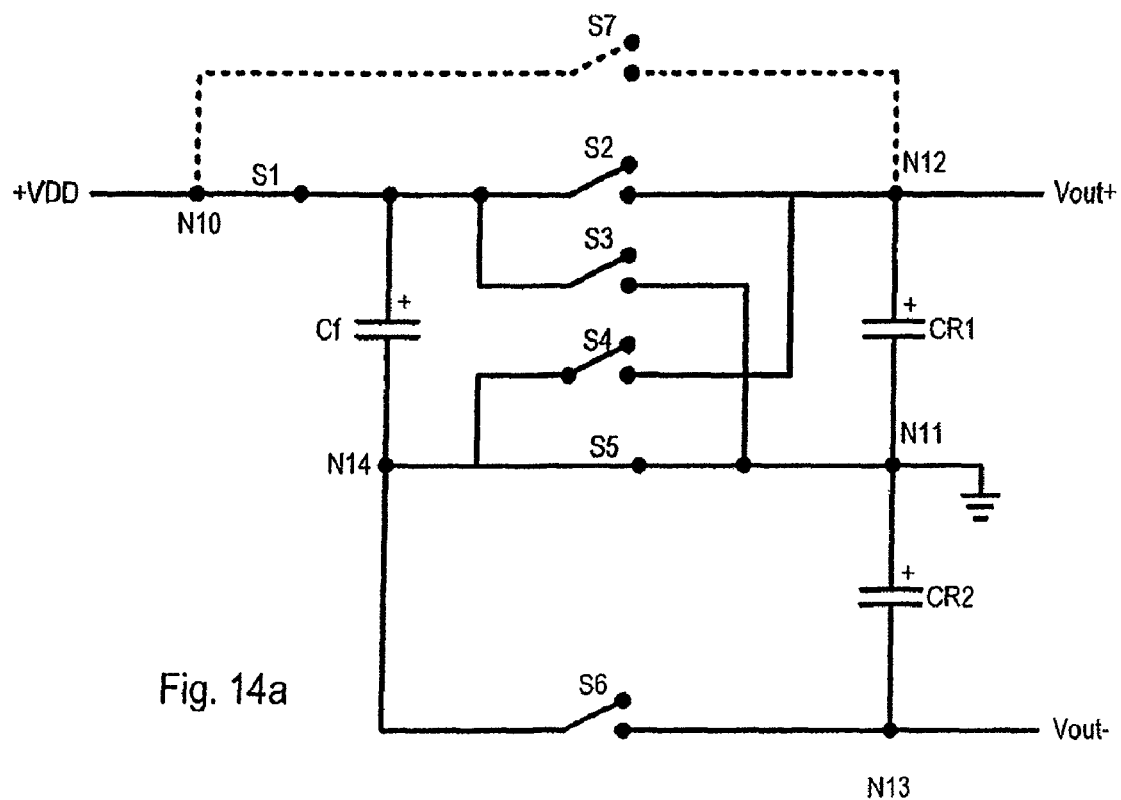
FIGS. 14a and 14b show, respectively, the circuit with the switch array in a seventh state and an equivalent circuit of this state.
Figure 14B:
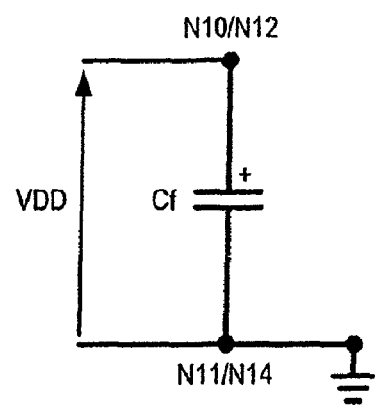

FIG. 14a shows an additional state, "State 7", which can be introduced into this Mode 2(a) sequence to create a slightly different implementation, referred to now as Mode 2(b). In State 7, switches S1 and S5 are closed (S2, S3, S4 and S6 are open). This state 7 connects the flying capacitor Cf across the input voltage +VDD. This state can be followed by states 6 then 2 and then back to 7 etc. FIG. 14b shows an equivalent circuit for this State 7 operation.

FIG. 15 illustrates the non-overlapping control signals (CS1-CS3 & CS5-CS7) for controlling the switches (S1-S3 and S5-S7) to generate a repeating sequence of the three states 7, 6, 2, 7, 6, 2, etc. . . . that defines Mode 2(b). Again, this represents only one example out of many possibilities for the controlling sequence. The inclusion of State 7 before State 6 is intended to isolate CR1 from the influence of CR2, and hence combat cross-regulation. On the other hand, the inclusion of State 7 reduces the time available for charge transfer in the main States 2 and 6, so that regulation as a whole may be improved if State 7 is simply omitted (Mode 2(a)). These are design choices.

Whichever pattern is chosen, one of the states may be used less frequently than the others (as was described above in relation to Mode 1). For instance, if the loads on the two output nodes N12, N13 are unbalanced (either permanently or according to signal conditions), one of the States 6 and 2 could be included less frequently than the other, as capacitor CR1 may need to be charged less frequently than capacitor CR2 or vice versa.

Modes 2(c) and (d) are further alternative modes of operation to generate +/-VDD, which are possible when the DMCP is provided with switch S7. This switch may used to replace the combined functionality of switches S1 and S2 for generating the positive output voltage at node N12 in applications where the high-side load, i.e. the load connected between nodes N12 and N11, does not require a lot of current. This may be where the load has a high input resistance as with a "Line Output" for a mixer for example. In such a case the size and the drive requirements of switch S7 can be reduced and modified compared to those of switches S1 and S2. Indeed, switch S7 can be constantly switched on during operation in Mode 2(c) which has advantages in that there is less power required to drive the switches and switch S7 would not, in the case of a MOS switch implementation, inject any charge into either nodes N10 or N12 due to its parasitic gate-drain and gate-source capacitances. It should also be noted that switch S1 is still required to operate so as to generate the negative output voltage -VDD. Still further, it should be noted that switch S2 may be operated on an infrequent basis so as to also connect the flying capacitor Cf and high-side reservoir capacitor CR1 in parallel.

Figure 16:
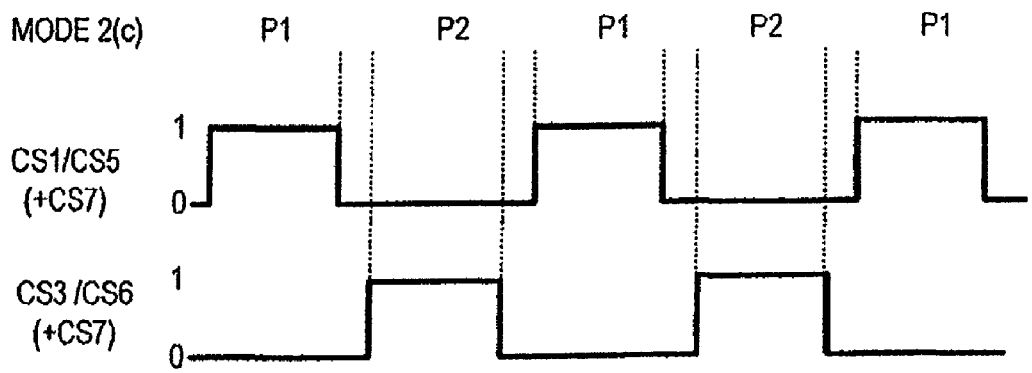

FIG. 16 illustrates the non-overlapping control signals (CS1-CS3 & CS5-CS7) for controlling the switches (S1-S3 and S5-S7) during the two alternating states of Mode 2(c). Summarising Mode 2(c), therefore, switch S7 is permanently (or near permanently) closed. A modified State 6 is used to charge the flying capacitor Cf and capacitor CR1 in parallel, this now being achieved by having switches S1, S5 and S7 closed only. A modified State 2 is then used to transfer this charge to capacitor CR2 via switch S3, S6 as before, but this time with capacitor CR1 still having voltage VDD across it due to S7 being closed.

Figure 17:
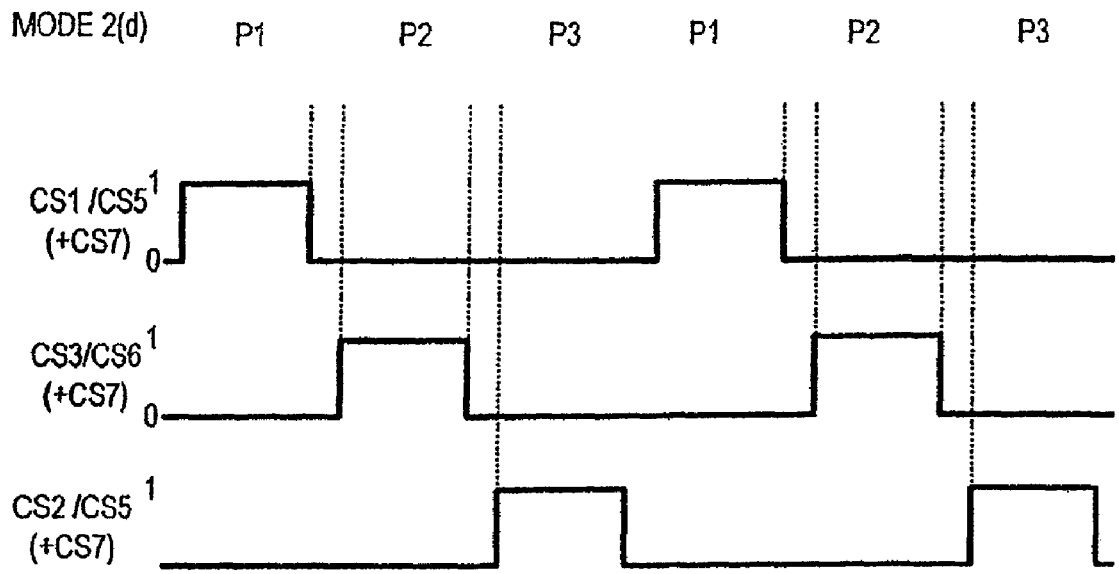

FIG. 17 illustrates non-overlapping control signals (CS1-CS3 & CS5-CS7) for controlling the switches (S1-S3 and S5-S7) during three states in a variation of Mode 2(c) referred to as Mode 2(d). The difference relative to Mode 2(c) is similar to the difference between Modes 2(a) and 2(b), in that an extra phase is inserted with the switches in State 7, wherein switches S1 and S5 are closed (S2, S3, S4 and S6 are open; S7 can remain closed throughout). Note that Mode 2(d) follows a sequence 7, 2, 6, 7, 2, 6 . . . rather than 7, 6, 2. There is not necessarily any great difference in the effect of these modes, but the freedom to vary the sequence can simplify the control logic, as will be seen in the discussion below.

TABLE 1

|  | S1 | S2 | S3 | S4 | S5 | S6 | S7* |
| --- | --- | --- | --- | --- | --- | --- | --- |
| State 1 | 1 | 0 | 0 | 1 | 0 | 0 | 0 |
| State 2 | 0 | 0 | 1 | 0 | 0 | 1 | 1++ |
| State 3 | 0 | 1 | 0 | 0 | 1 | 0 | 0 |
| State 4 | 1 | 0 | 0 | 0 | 1 | 0 | 0 |
| State 5 | 0 | 1 | 0 | 0 | 0 | 1 | 0 |
| State 6 | 1 | 1 | 0 | 0 | 1 | 0 | 0 |
| State 6+ | 1 | 0 | 0 | 0 | 1 | 0 | 1 |
| State 7 | 1 | 0 | 0 | 0 | 1 | 0 | 0 |
| State 7++ | 1 | 0 | 0 | 0 | 1 | 0 | 1 |

*if present
+Modes 2c and 2d
++Mode 2d

Table 1 illustrates the switch (S1-S7) states for the seven states described above, with a "0" representing an open switch and a "1" representing a closed switch. Note that the switch network and controller do not need to implement all states 1 to 7, if only a subset of the described modes will be used in a particular implementation.

Again, these four example sequences and seven or eight different states of the switch network are not the only possibilities for the controlling sequence. Again, a number of different sequence implementations are possible and some of these states may be used less frequently than others, depending on load.

Figure 18:
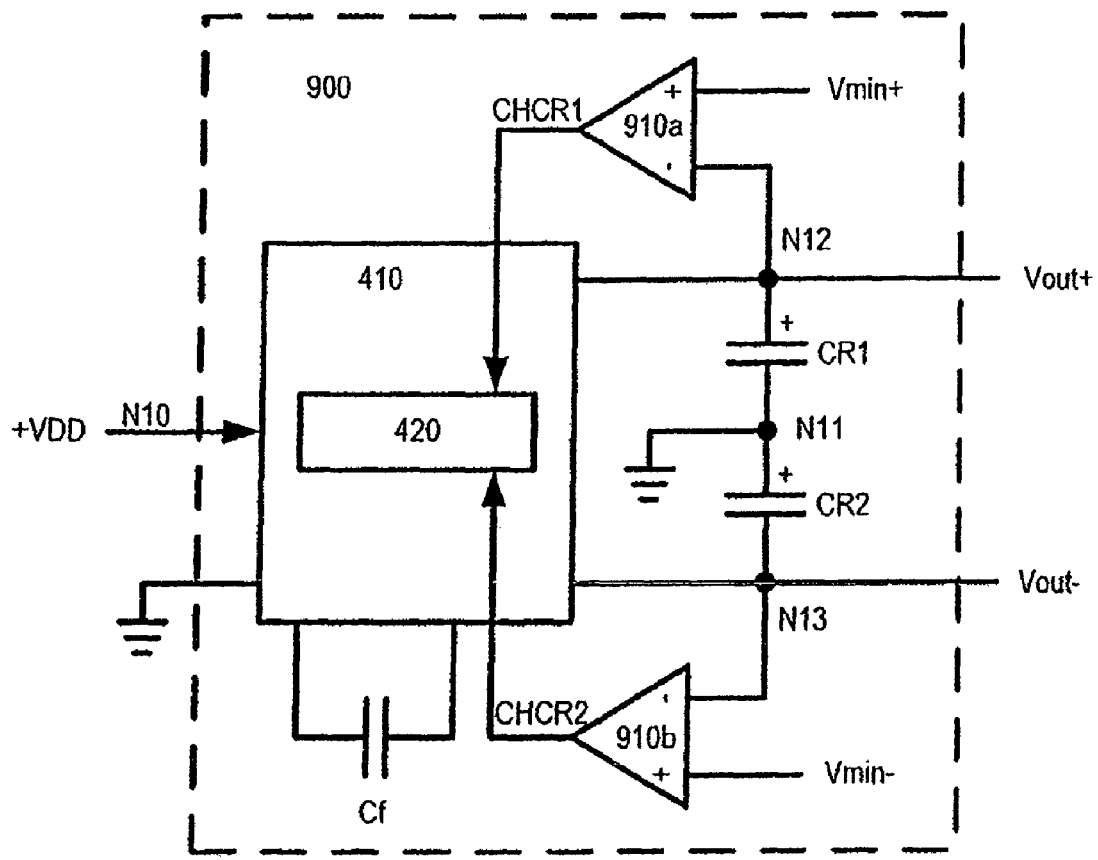
FIG. 18 shows a variation on the circuit of FIG. 5, operable in a closed loop configuration.

FIG. 18 illustrates a similar LSCP/DMCP 900 circuit as illustrated in FIG. 4 or FIG. 10 except that the LSCP/DMCP 900 also includes two comparators 910a, 910b for regulating the two output voltages.

It should be noted that LSCP/DMCP 900 represents a closed-loop LSCP/DMCP. Each of the comparators 910a, 910b compares their respective charge pump output voltages (Vout+, Vout−) with a respective threshold voltage (Vmin+, Vmin−) and outputs a respective charge signal CHCR1 and CHCR2. These charge signals CHCR1, CHCR2 are fed into the switch control module 1420 to control the switch array 1410 causing the LSCP/DMCP to operate charging either the relevant reservoir capacitor. If either output voltage droops past its respective threshold, the charge pump is enabled; otherwise the charge pump is temporarily stopped. This reduces the power consumed in switching the switches, especially in conditions of light load.

This scheme allows output voltages up to +/−VDD/2. It should be further noted that in this configuration, the LSCP/DMCP 900 may be used to generate higher voltages, but with a drop in efficiency. In this case, the reference voltages (Vmin+Vmin−) can be adjusted to adjust the output voltages accordingly. The flying capacitor Cf is charged up to +VDD (via switches S1 and S5) and then connected in parallel across either reservoir capacitor CR1 (via switches S2, S5) or CR2 (via switches S3, S6) to raise their voltages to the levels set by the reference voltages. Such an operation increases the ripple voltages on the reservoir capacitors CR1, CR2 but it also reduces switching losses. However, by scaling the reservoir capacitors CR1, CR2 relative to the charging capacitor Cf, the ripple voltages can be reduced. It is possible, therefore, for the gain control signal S2' of FIG. 2 to control the reference voltages (Vmin+Vmin−) and therefore control the output voltages Vout+ and Vout− of the variable voltage power supply 80.

Figure 19:
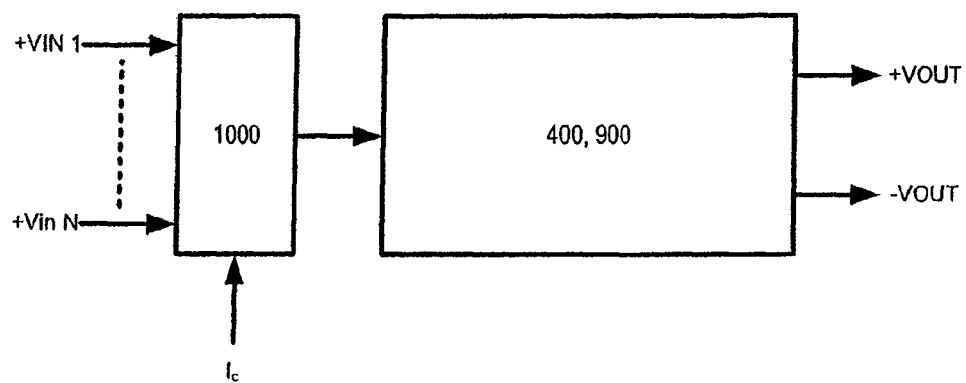
FIG. 19 shows a variable voltage power supply of a type suitable for any of the novel amplifiers disclosed herein whereby a number of different input voltage values may be selected as an input voltage to any of the Level Shifting/Dual Mode Charge Pumps disclosed herein.

FIG. 19 illustrates a variable voltage power supply 80 utilising any of the novel Charge Pumps 400, 900 described above, wherein one of a number of different input voltage values may be selected as an input voltage to the LSCP/DMCP 400, 900. It shows an input selector 1000 having a number of different voltage inputs (+Vin 1 to +Vin N), the actual input chosen being determined by control input Ic. The chosen voltage level then serves as the input voltage VDD for the charge pump 400, 900.

Figure 20:
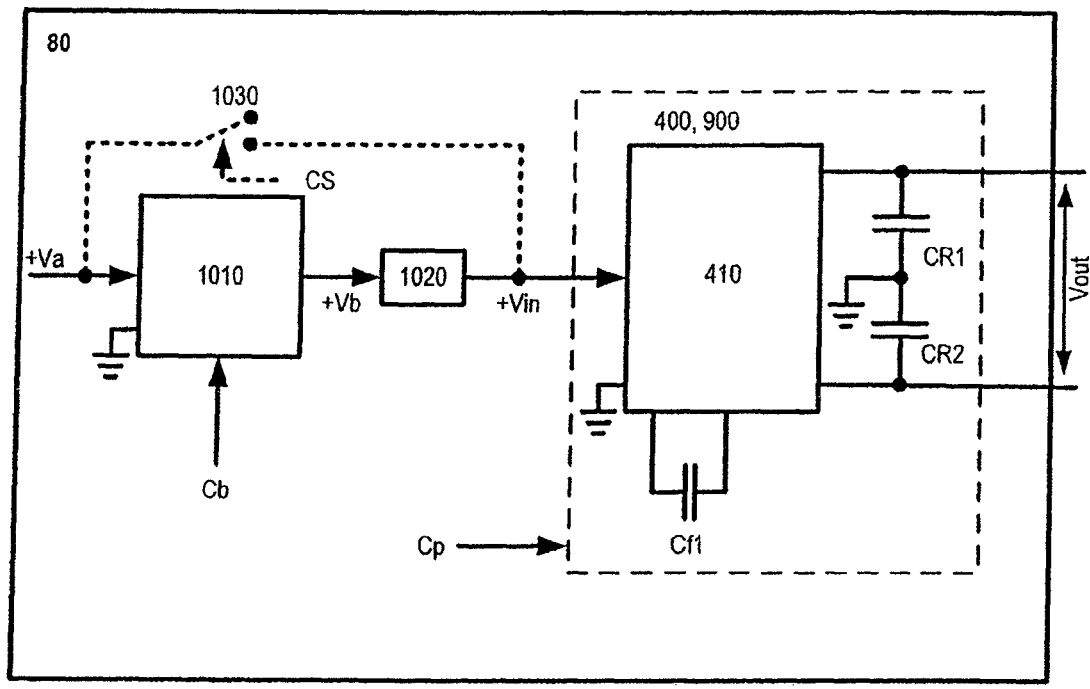
FIG. 20 shows a variable voltage power supply of a type suitable for any of the novel amplifiers disclosed herein.

FIG. 20 shows a more detailed variation of FIG. 19 and which may be used as the variable voltage power supply 40 of the novel amplifier 100. This shows a buck converter fed by an input voltage +V1 from, for example, a battery. The buck converter also receives a control signal Cb. The output of the buck converter is fed through a line regulator (in this case a low drop out regulator), before being input into any of the LSCP/DMCPs described above.

In use, the Buck Converter 1010 receives an input voltage +Va (5v for example) and outputs a lower voltage +Vb (3.2 for example). It is preferable to pass the output voltage +Vb of the Buck Converter 1010 through a Linear Regulator such as a Low Drop Out (LDO) 1020 regulator before inputting the voltage from the Buck Converter 1010 into the LSCP/DMCP. The LDO 1020 receives the output voltage Vb from the Buck Converter 1010 and outputs a slightly lower voltage +Vin (3v for example) which constitutes the input voltage of the LSCP/DMCP 400, 900.

It is preferable to use the LDO 1020 since both the Buck Converter 1010 and the LSCP/DMCP 400, 900 are switching regulators and it is preferable to clean up the switching effects relating to the output voltage +Vout of the Buck Converter 1010 before it is fed into the LSCP/DMCP 400, 900.

The output voltage +Vout of the Buck Converter 1010 can be adjusted via an external control signal Cb, possibly by changing its duty cycle. In this way, the input to, and therefore the outputs from, the LSCP/DMCP 400, 900 is/are controllable. When used as the Variable Voltage Power Supply for any of the novel amplifiers disclosed herein, it is envisaged that control signal Cb is, or is derived from, gain control signal S2'. Additionally, the output voltages of the LSCP/DMCP 400, 900 can be adjusted (independently) via an external control signal Cp.

An additional feature is a bypass switch 1030 that may be employed in a situation where there is a need to connect the input voltage +V1 directly to the input of the LSCP/DMCP 400, 900. This feature is useful where +V1 is supplied from a battery that has slowly discharged to a voltage level for which the Buck Converter 1010 cannot or cannot efficiently generate +Vout and hence +Vin.

Variations on the Basic Amplifier Design

Figure 21A:
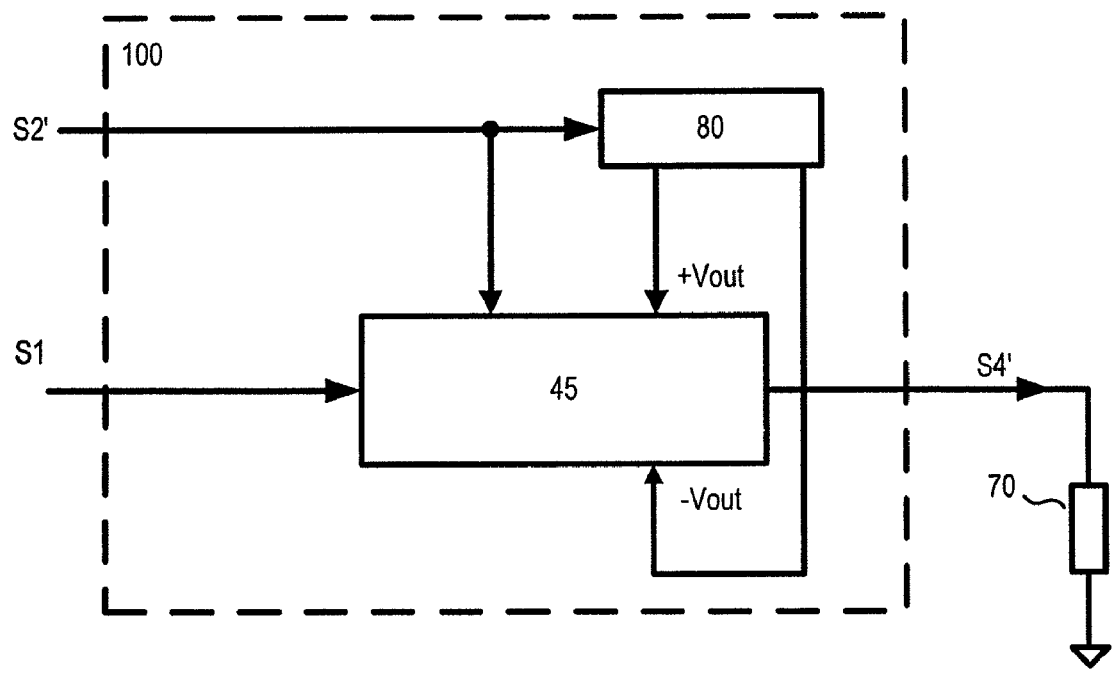
FIGS. 21a to 21e show apparatus according to an embodiment of the invention with alternatives.

FIG. 21*a* illustrates a variant embodiment of the circuit of FIG. 2*a*. This embodiment works in essentially the same manner as the embodiment described in relation to FIG. 2*a* above. The main difference in this FIG. 21*a* embodiment is that its output stage 45 combines the functions of the gain controller 20 and output stage 40 of FIG. 2*a*. Therefore, the FIG. 21*a* output stage 45 receives the gain control signal S2' which, as will be described and illustrated below, may act on a feedback loop within the output stage 45.

FIGS. 21*b*-21*e* illustrate a number of different methods in which the amplifier 100 of FIG. 21*a* can be controlled by the control signal S2'. FIGS. 21*b*-21*e* illustrate non-exhaustive examples and many other arrangements will be apparent to the skilled reader. Each of these FIGS. 21*b*-21*e* shows detailed elements comprising, or included in, the output stage 45 FIG. 21*a*.

Figure 21B:
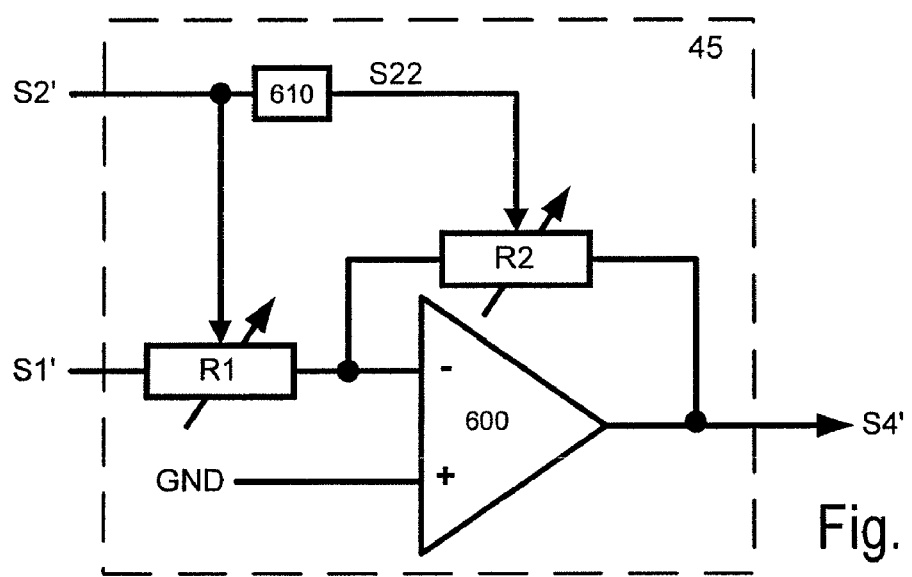

FIG. 21*b* illustrates the output stage 45 comprising an amplifier 600 and variable resistors R1 and R2 arranged as illustrated. The control signal S2' acts to change the resistance of one or both resistors. The gain G of the amplifier 600 is varied by varying the resistance ratio of resistors R1 and R2. Consequently, only one of these resistors need be variable and controlled by the control signal S2'. If both the resistors are varied, then one resistor may be controlled by the control signal S2' and the other may be controlled by a derivative signal S22, produced for example by a signal inverter 610, so that when R1 increases, R2 decreases, and vice versa. It should be noted that in this embodiment, resistors R1 and R2 represent a gain controller that is arranged to control the gain G of the amplifier 600 applied along the signal path, the signal path extending from the input terminal of the amplifier 600 to its output terminal, wherein the gain G is controlled in response to the control signal S2'. Control signal S2' may be a digital control word, in which case S22 may be say the lower bits of the control word, while R1 may be controlled by the higher bits of the control word.

Figure 21C:
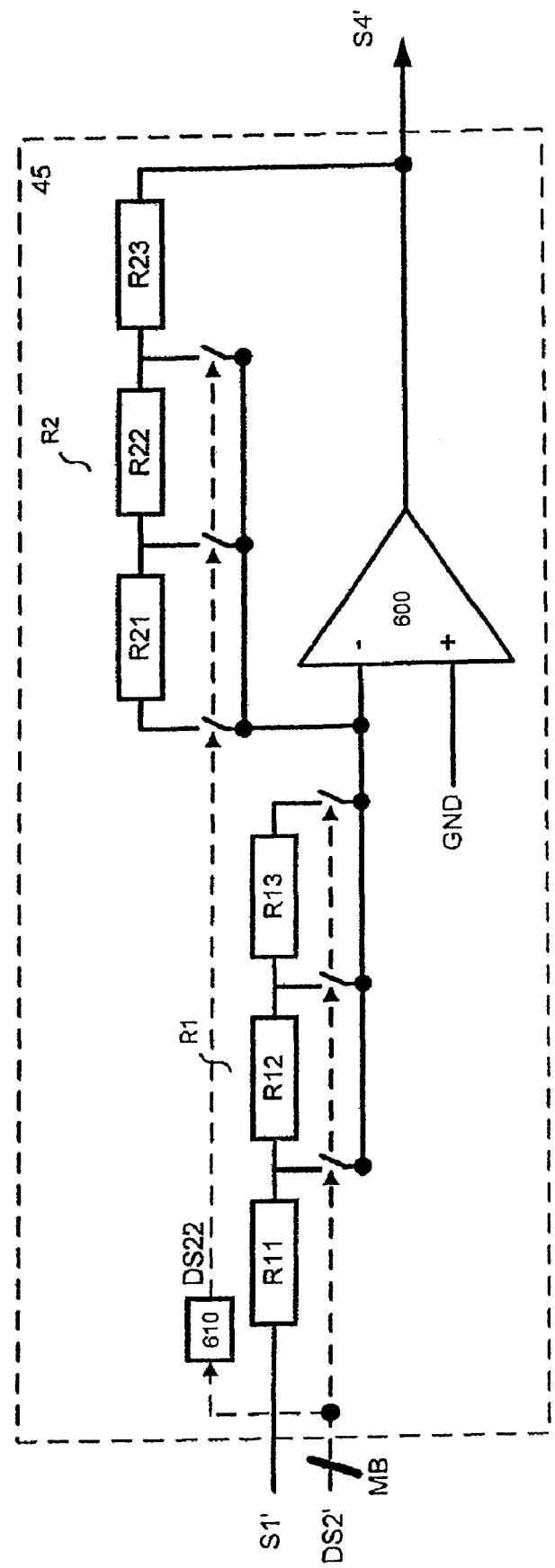
Figure 21D:
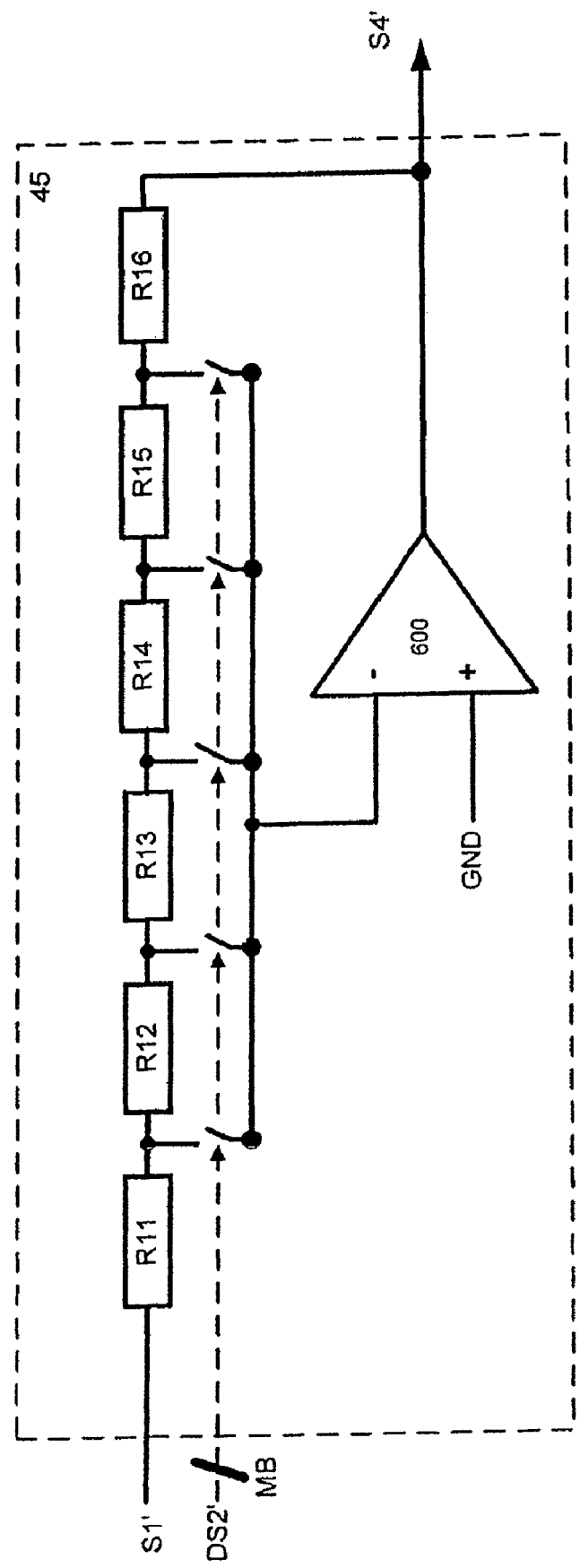

FIG. 21*c* illustrates a variation of the output stage 45 illustrated in FIG. 21*b*. FIG. 21*c* illustrates an embodiment having respective resistor and switch arrangements, as illustrated, that represent the resistors R1 and R2. In this particular embodiment, the respective control signals DS2', and its derivative DS22, are digital versions of the respective control signals S2' and S22 illustrated in FIG. 21*b*. Also, control signal may be a multibit control signal as indicated by the line MB. FIG. 21*d* illustrates a similar arrangement to that illustrated in FIG. 21*c*.

Figure 21E:
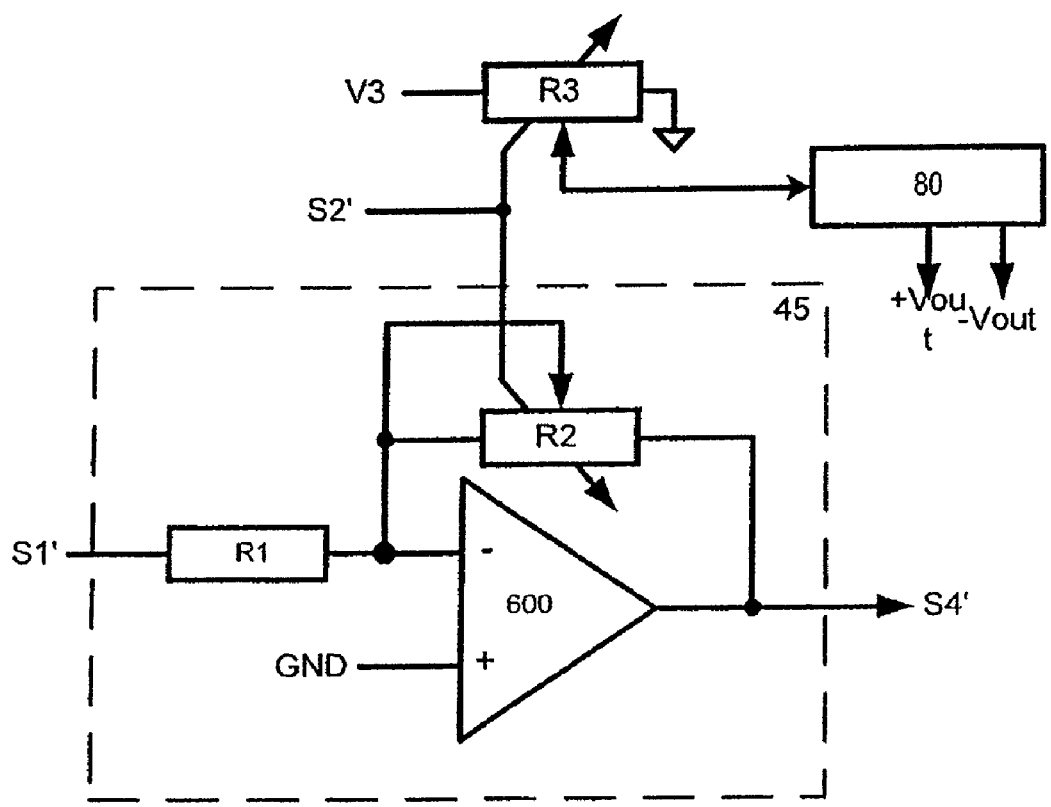

FIG. 21*e* illustrates another variation of the output stage 45 illustrated in FIG. 21*b*.

FIG. 21*e* illustrates a ganged potentiometer R2, R3. In this particular embodiment, the resistance of the ganged potentiometers R2 and R3 are dependent on the control signal S2'. The control signal S2' controls these ganged potentiometers such that R2 is adjusted so as to vary the gain G of the amplifier 600 while R3 is adjusted so as to vary the output voltage Vout of the variable voltage supply 80. If S2' controls R2 to give a higher resistance, the output signal voltage swing will increase. To allow for this, the wiper on R3 is moved to give a higher input reference voltage into variable power supply 80.

Figure 22A:
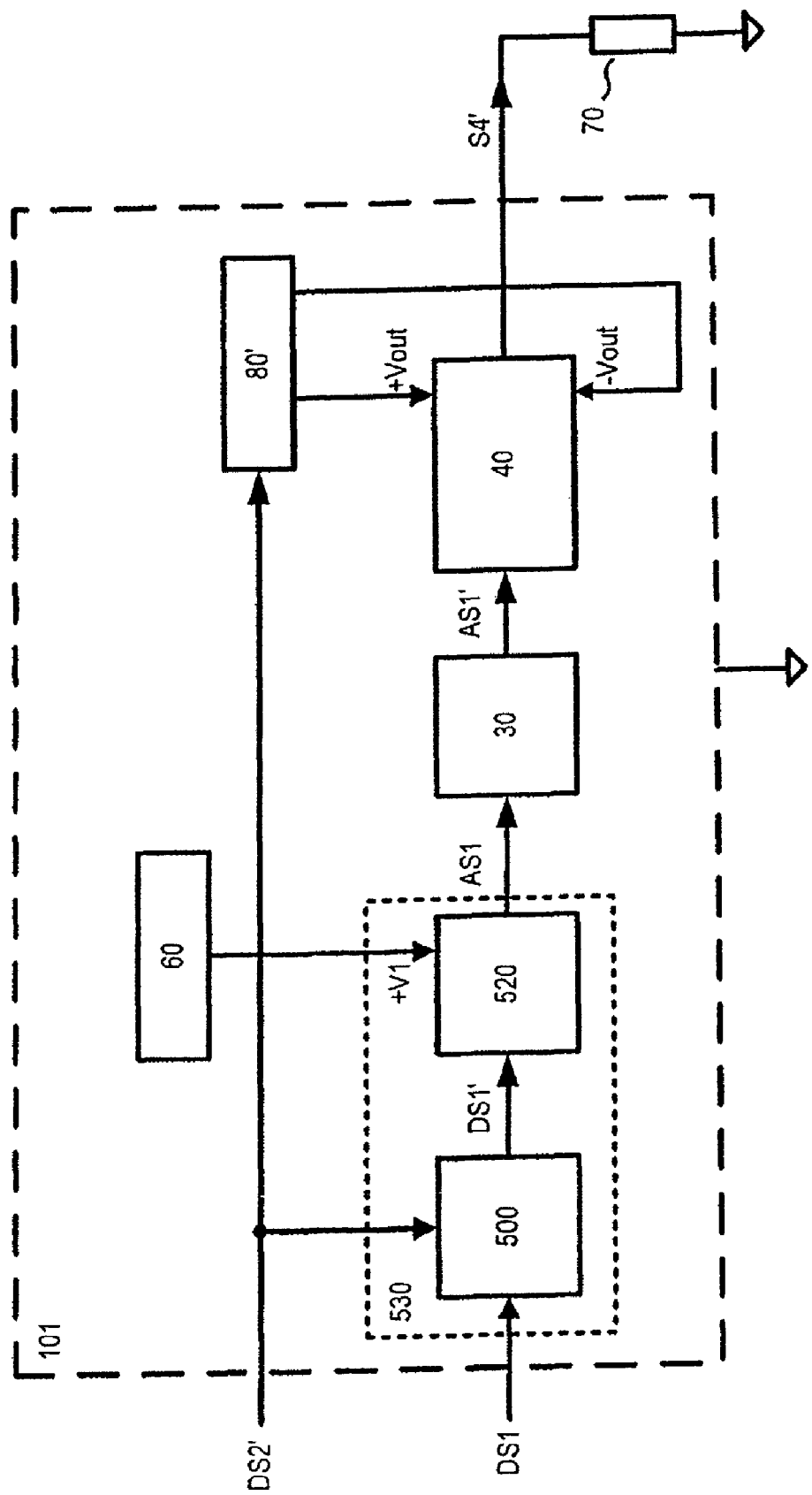
FIGS. 22a-22c shows apparatus according at an embodiment of the invention with alternatives.

FIG. 22*a* illustrates a variation on FIG. 2*a* wherein the gain control is controlled digitally.

FIG. 22*a* illustrates an amplifier 101 that comprises a digital signal processor (DSP) 500, such as a multiplier for example, and a digital to analogue converter (DAC) 520, such as a resistor/switch network, inserted in place of the gain controller 20 illustrated in FIG. 2*a*. The DSP 500 and DAC 520 form an input stage 530. The DSP 500 receives a digital input signal DS1 from a data source (not illustrated), (such as a solid-state memory or information carrier, such as a CD or DVD for example), and a digital gain control signal DS2'. The gain control signal DS2' acts upon the DSP 500 and as a result DSP 500 varies its digital input signal DS1 such that it outputs a gain controlled digital output signal DS1'. The DAC 520 receives the gain controlled digital signal DS1' and outputs a corresponding gain controlled analogue signal AS1 which is processed in the same manner as described above in connection with FIG. 2*a*.

In this FIG. 22*a*, the DAC is driven by a single supply 60 while the output is driven from the dual, i.e. split, variable voltage power supply 80', with a level shifter 30 required to translate signal AS1 at quiescent voltage +V1/2 to a ground-referenced signal AS1', but no level shifter is required between the ground-referenced output S4' and the grounded load 70.

In a further variation, the digital control signal DS2' may act directly on the structure of the DAC 520 rather than actually modulate a voltage, by, for example, selecting the size of a capacitor periodically connected to a fixed DAC full-scale reference, to scale a charge used to represent DAC full-scale signal, or by selecting the size of a resistance connected to a fixed DAC full-scale reference to scale a current used to represent a DAC full-scale signal, rather than by directly modulating a (decoupled) reference voltage.

It should be noted that the variable voltage power supply 80' in this particular embodiment should be designed to be controlled by a digital control signal DS2' as opposed to an analogue control signal. The design of such a digitally controlled variable voltage power 80' supply will be readily appreciated and facilitated by those skilled in the art.

Figure 22B:
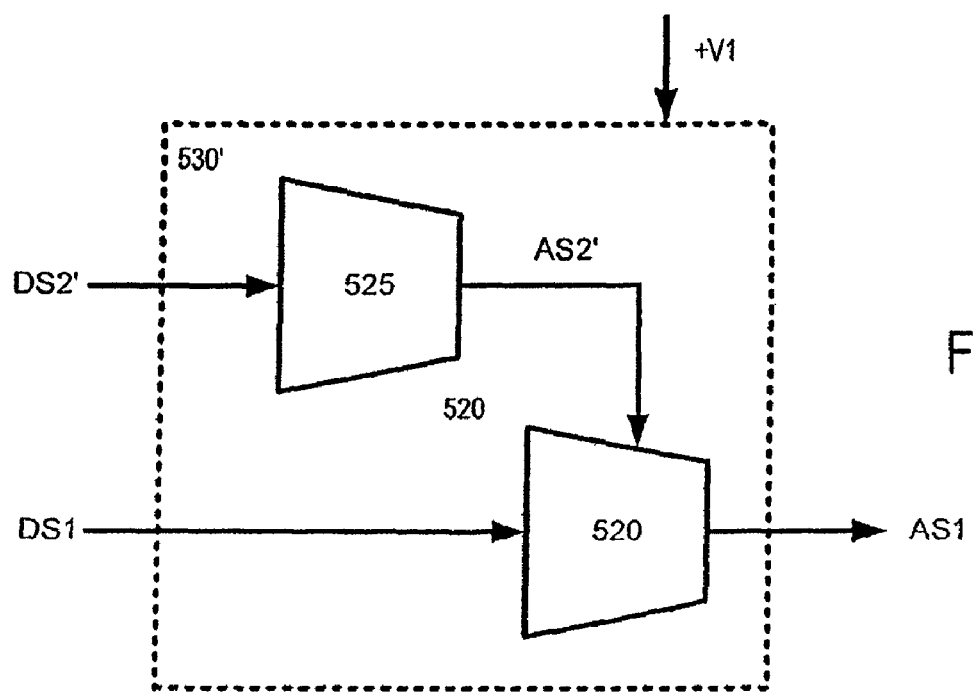

FIG. 22*b* illustrates a variation of the digital control and manipulation as performed by the DSP 500 and DAC 520 in FIG. 22*a*.

FIG. 22*b* illustrates the first DAC 520 as directly receiving the digital input signal DS1 from a data source (not illustrated) and outputting the gain controlled analogue signal AS1'. A second DAC 525 replaces the DSP 500 and receives the digital control signal DS2'. The DACs 520 and 525 form an alternative input stage 530'. This second DAC 525 outputs an analogue gain control signal AS2' that is used to control the first DAC 520. For example AS2' may be used as the full-scale reference voltage for the DAC, so the output for a given digital input word (DS1) will scale directly with the reference voltage i.e. the gain control signal AS2'. It should be noted that either the digital gain control signal DS2' or its derived analogue equivalent AS2' may be used to control an appropriately arranged variable voltage power supply.

Figure 22C:
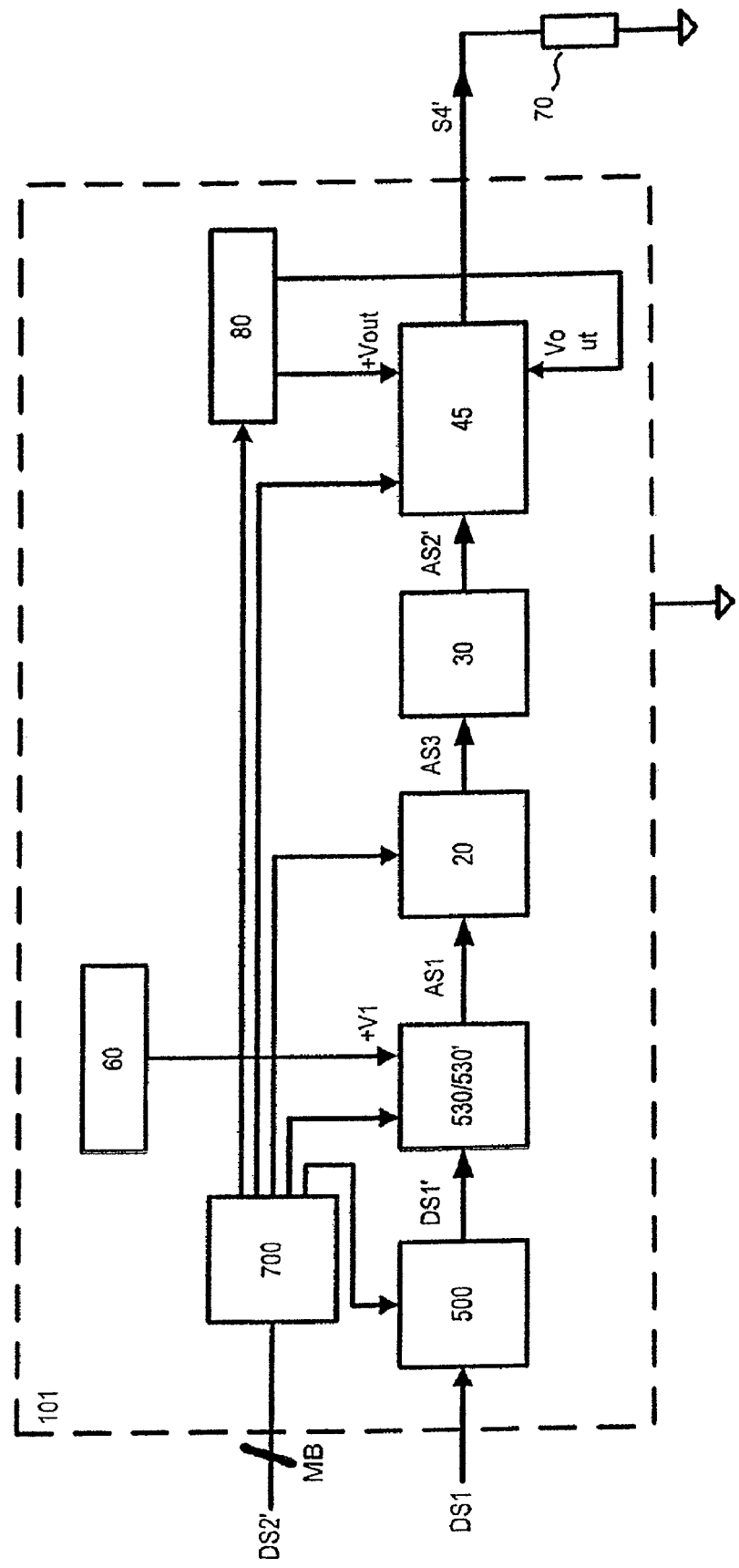

FIG. 22*c* illustrates an embodiment wherein the gain control of amplifier 101 may act at multiple points in its signal path between signal input and output. An input digital signal DS1 is multiplied in DSP 500, the resultant scaled digital signal DS1' is input to either input stage 530 or its alternative 530 which scales the signal DS1' (perhaps as described above) to give an analogue signal AS1 which is then scaled by a gain controller 20 to give a signal AS2 which is then level shifted by a level shifter 30 to give a signal AS2', which is then further scaled within a variable gain output amplifier 45. Each of the elements 500, 530/30', 20, 45 receives, from a controller block 700, a respective gain control signal, as illustrated, according to an overall input gain control signal DS2'. Signal DS2' is also used to derive the appropriate power supply control signal to feed into variable power supply 80'. It would also be possible for the gain control signal DS2' to be a multibit control signal (as illustrated) comprising individual words to control each gain block, and for controller 700 to calculate the appropriate power supply control signal, according to a calculated cascaded gain. The controller 700 may be implemented by means of a look-up table, such an implementation be readily understood by those skilled in the art.

FIGS. 21 and 22 illustrate that the actual gain control may act at any point or multiple points, in the amplifier's (100, 101) signal path between signal input and output, whether it be in the digital or analogue domain, and preceding or combined with the output stage 40.

Figure 23A:
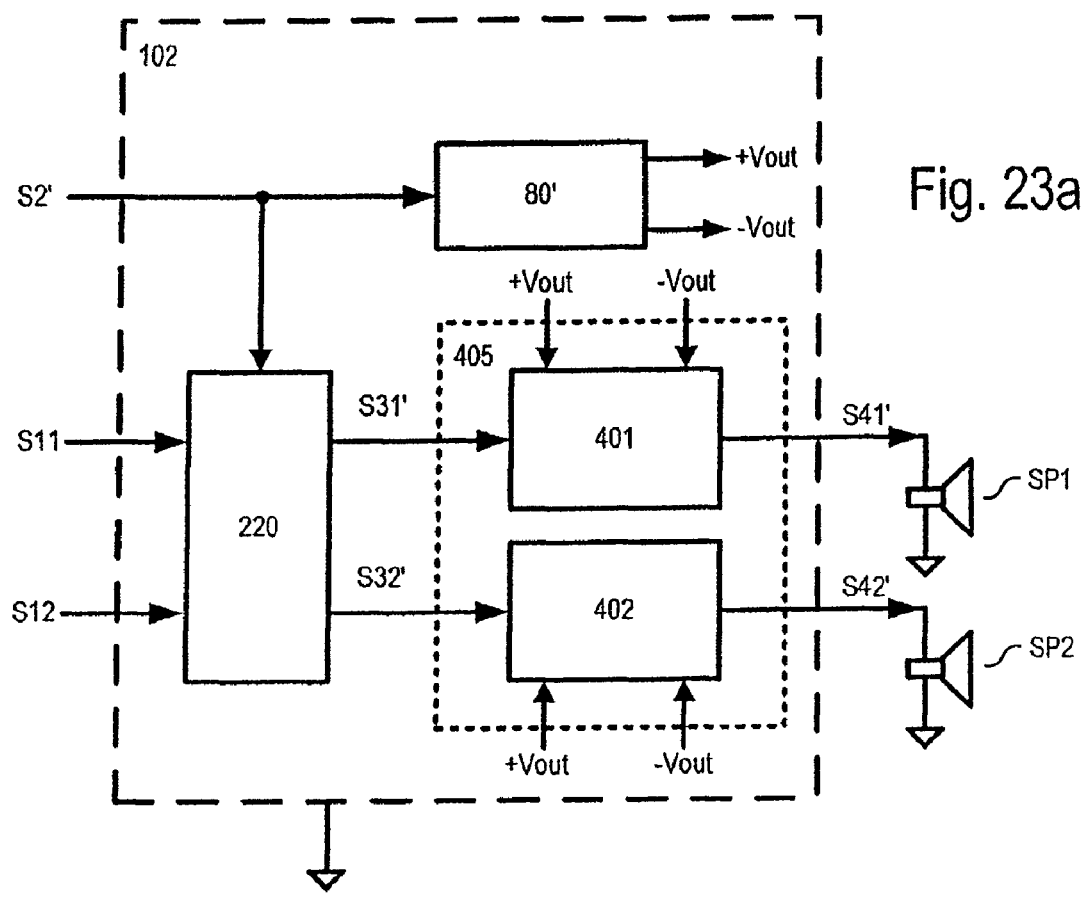
FIGS. 23a and 23b show two alternative apparatus according to an embodiment of the invention.

FIG. 23a illustrates a variation on the embodiment of FIG. 2a for, in the case of audio applications, stereo systems.

Dual input signals S11, S12 are fed into a gain unit 220 that comprise a gain controller 20 (not illustrated) and possibly a level shifter 30 (not illustrated) for each of the input signals S11 and S12 driven from a fixed supply 60 (not illustrated). The gain unit 220 outputs respective gain controlled signals S31', S32'. The two gain controllers 20 (not illustrated) are controlled by a common gain or volume or level control signal S2'. The respective gain controlled signals S31', S32' are fed into respective output stages 401, 402, which output respective output signals S41', S42' which are then fed into left and right speakers (not illustrated) or a stereo headphone (not illustrated). The power unit 200 contains the power supplies 60 and 80 as illustrated in FIG. 2a.

The headphones referred to above may be either physically connected, by means of electrical wires, to the amplifier 102 or they may not, in which case the headphones may, for example, receive the signals S11' and S12' via, for example, infrared or RF signals. In either of these headphone arrangement examples it will be appreciated by those skilled in the art that the amplifier 102 may in whole or in part be included as part of the headphones.

Figure 23B:
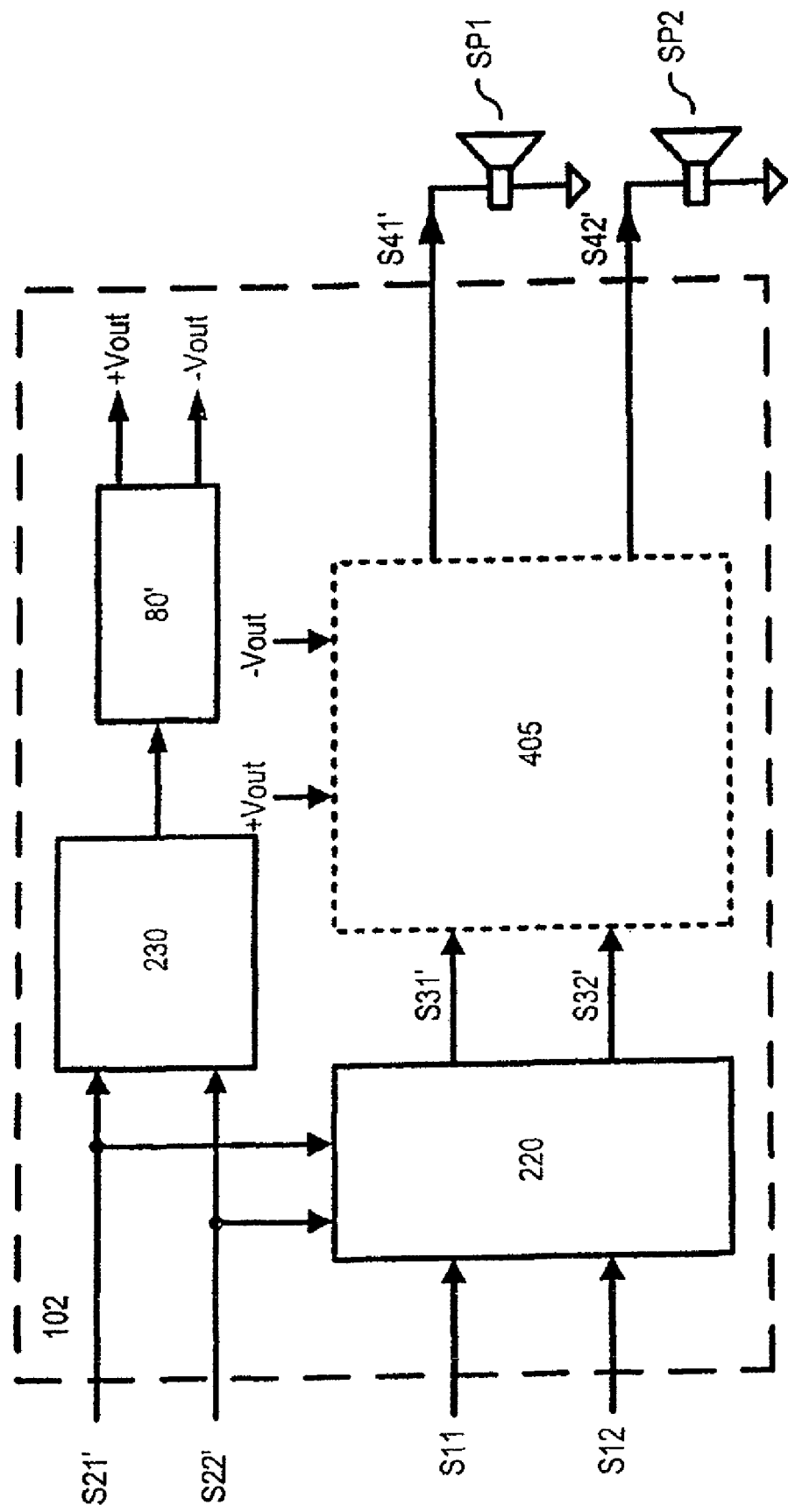

FIG. 23b illustrates a variation of part of the amplifier 102 illustrated in FIG. 23a.

FIG. 23b illustrates an amplifier 102 that receives two input control signals S21' and S22' that respectively control gain controllers (not illustrated) within the gain unit 220. The two input control signals S21' and S22' are also fed into a controller unit 230 that detects the maximum value of the two control signals S21' and S22' such that the variable voltage power supply 80, and therefore the supply voltages +/−Vout, is varied in response to the greater of the two volume control signals S21' and S22'. The two control signals may represent separate volume control signals in an application where either a balance control or separate volume controls for each input signal is required.

An alternative arrangement (not illustrated) to that of FIG. 23b is where the control signals S21' and S22' each control a variable voltage power supply that supplies power to the respective output stage to which the control signal relates.

A further alternative arrangement (not illustrated) to that of FIG. 23b is where the gain unit 220 or respective elements thereof are fully or partially incorporated into the output stage unit 405 or respective elements thereof.

Figure 24:
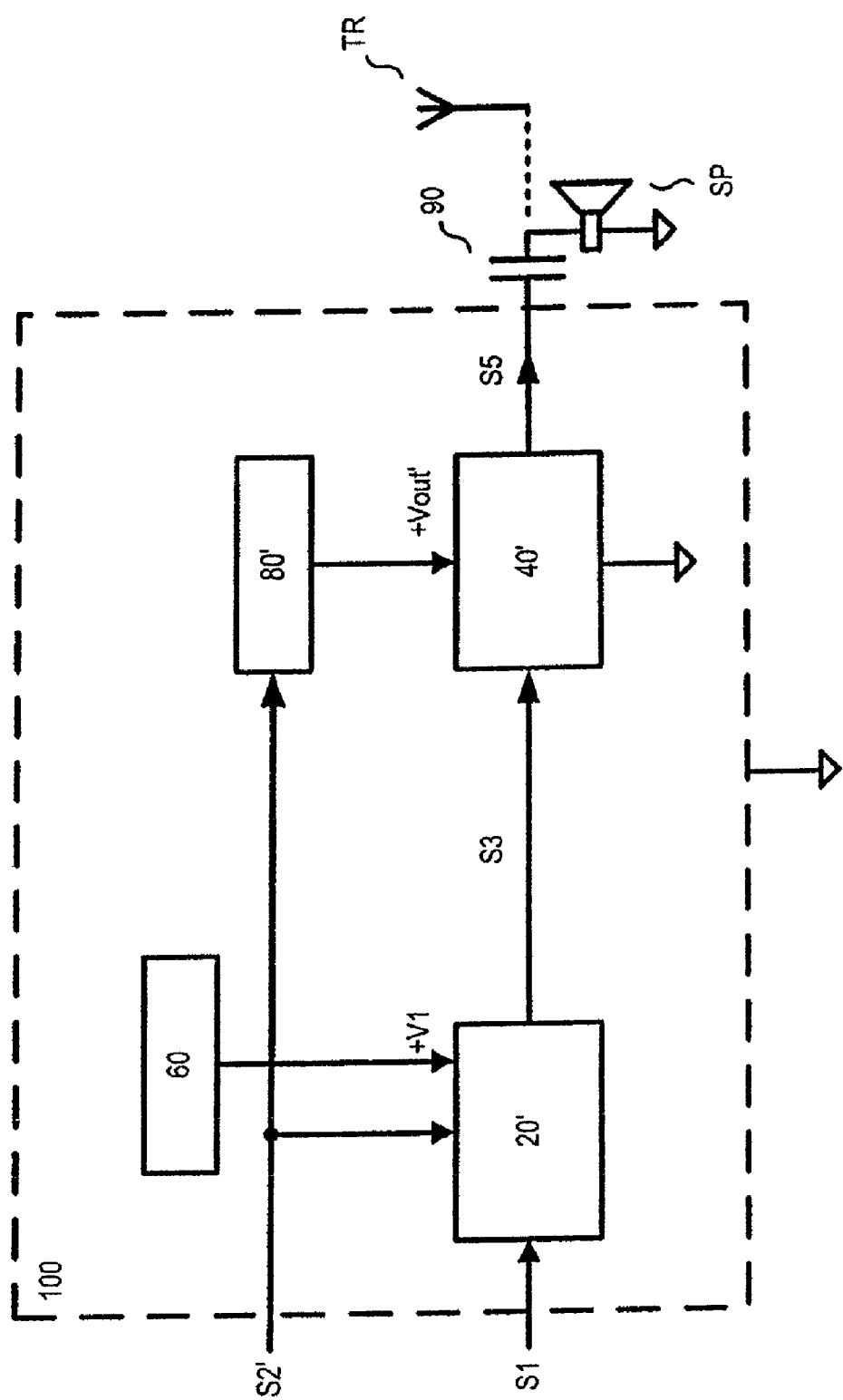
FIG. 24 shows schematically a first system using an embodiment of the invention.

FIG. 24 illustrates the amplifier 100 with different transducers, i.e. loads, that represent non-exhaustive illustrations of basic applications for the novel amplifier. It will be appreciated that illustrated example embodiments of this FIG. 24, and FIG. 25, are equally applicable to dual ground referenced voltage systems such as illustrated in FIG. 2a.

In a first of two illustrated examples of FIG. 24, the amplifier 100 may be employed in an audio system, such as: a portable music system (MP3) (including such devices combined with mobile telephone handsets or similar devices); Hi-Fi; In-Car Entertainment system; or a DVD player for example, whereby the system receives a volume, or level, control signal S2' that is altered by a user either via a potentiometer, i.e. a volume knob, or by a remote control device for example. In this particular example of an application, the output signal S5 of the amplifier 100 is used to drive a speaker SP. It will be appreciated to those skilled in the art that in modern audio systems it is quite usual to have a plurality of output signals such as, for example, in stereo systems or Dolby® pro logic 5.1 channel surround sound systems.

In a second illustrated example, the amplifier 100 may be employed in a transmitter system such as a mobile phone RF transmitter, whereby it receives a transmit power control signal S2'. In this particular example of an application, the output signal S5 of the amplifier 100 is used to drive a transmitter TR, such as an aerial for example.

Figure 25:
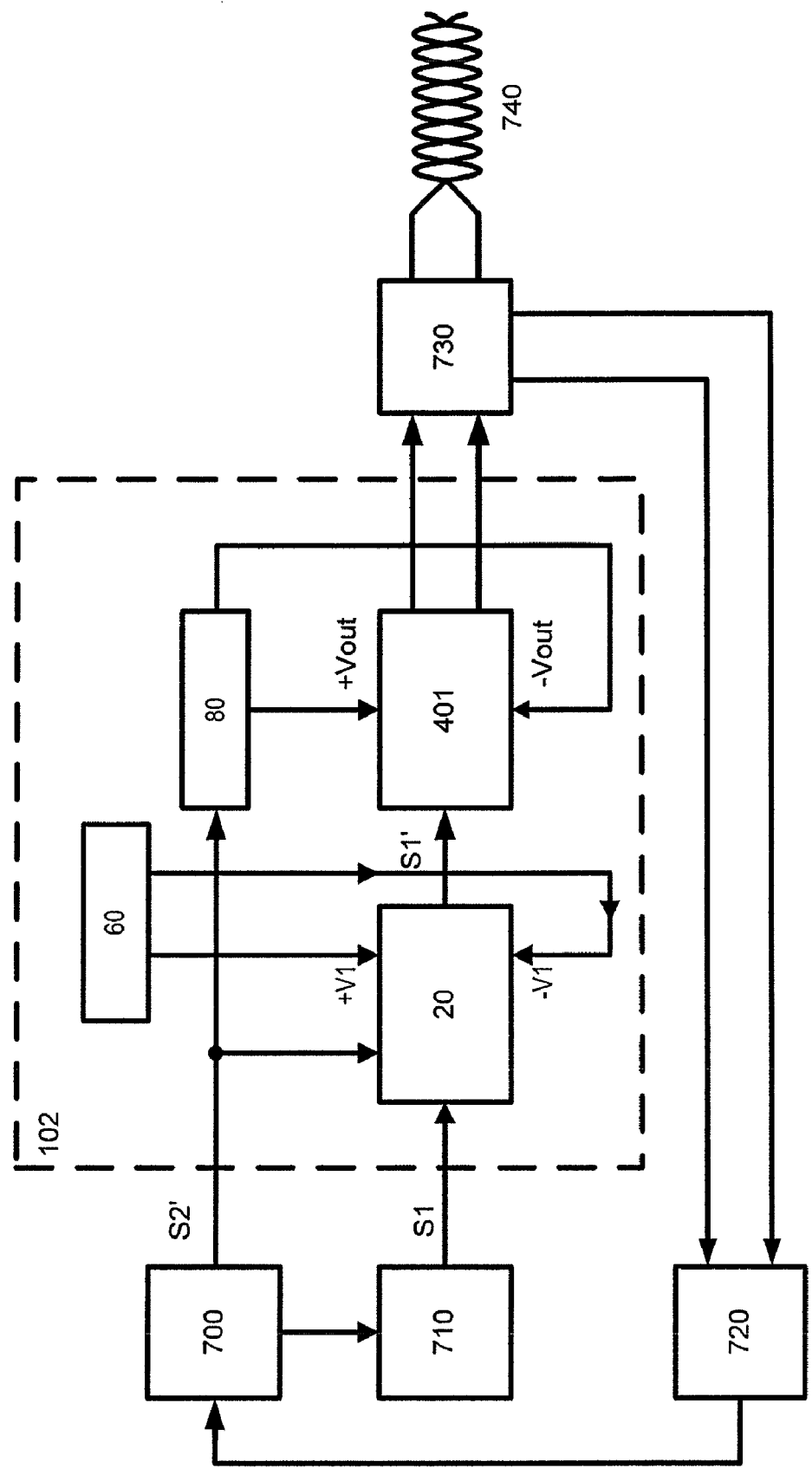
FIG. 25 shows schematically a second system using an embodiment of the invention; and, FIG. 26 shows a Level Shifting Charge Pump circuit suitable for use in the variable voltage power supply.

FIG. 25 illustrates a data transmitter/receiver system, such as a modem for example, wherein an amplifier 102 acts as a line driver for the data transmission/receiver system. A power supply 200, gain controller 20, line driver 401, system controller 700, signal modulator 710, signal demodulator 720, a transmit/receive controller 730 and transmission line 740 are arranged as shown. Again the amplifier 102 works in the same way as the previous examples with the variable voltage power supply supplying the line driver 401 with a dynamic voltage +/−Vout. The control signal S2' from the system controller 700 controls the gain controller 20 and the voltage level of the dynamic voltage +/−Vout. The modulator 710, which is also controlled by the system controller 700, provides the input signal S1 to the amplifier. The transmit/receive controller 730 allows for two-way signal transmission between the output of the amplifier 102 and the transmission line 740. Controller 730 may be a two-to-four wire hybrid to allow full duplex, or a switching element to allow transmission in one direction at a time. The transmit/receive controller 730 also allows a received signal to be fed back to the data transmitter/receiver system via the demodulator 720.

Such a novel amplifier as herein described may be implemented using discrete components or may be implemented on an integrated circuit or a combination of both.

It should be noted that the above described embodiments illustrate rather than limit the invention, and that those skilled in the art will be able to design many alternative embodiments without departing from the scope of the appended claims and drawings. The word "comprising" does not exclude the presence of elements or steps other than those listed in a claim, "a" or "an" does not exclude a plurality (unless context requires otherwise), and a single element may fulfil the functions of several elements recited in the claims. It should also be noted that the attenuation, or decrease, of a signal amplitude is a form of amplification, thus the word "amplify", "amplifying", "amplified" and the like can be taken to mean an increase or a decrease in the amplitude of a signal. Any reference signs in the claims shall not be construed so as to limit their scope.

What is claimed is:

1. A charge pump circuit comprising:
   an input node for receiving an input voltage;
   a common node;
   first and second output nodes for outputting first and second output voltages, respectively;
   a plurality of flying capacitor nodes;
   a network of switches for interconnecting said input node, said first and second output nodes and said plurality of flying capacitor nodes; and
   a controller for operating said switches, said controller being operable, in use with a first reservoir capacitor connected between said first output node and said common node, with a second reservoir capacitor connected between said second output node and said common node, and additionally with only a single flying capacitor connected to said flying capacitor nodes, in a first mode to operate said switches in a sequence of states so as to generate said first and second output voltages at said first and second output nodes, respectively, wherein said first and second output voltages are of opposite polarity to one another and each is substantially equal in magnitude to half of said input voltage.

2. A charge pump circuit as claimed in claim 1 wherein said controller is operable, in use with said first reservoir capacitor connected between said first output node and said common node, with said second reservoir capacitor connected between said second output node and said common node and additionally with said single flying capacitor connected to said flying capacitor nodes, in a second mode to operate said switched in a sequence of states so as to generate said first and second output voltages at said first and second output nodes respectively wherein said first and second output voltages are of opposite polarity to one another and each is substantially equal in magnitude to said input voltage.

3. A charge pump circuit as claimed in claim 1 wherein said plurality of flying capacitor nodes comprises only first and second flying capacitor nodes.

4. A charge pump circuit as claimed in claim 2 wherein said plurality of flying capacitor nodes comprise nodes for separate connections to a plurality of flying capacitors.

5. A charge pump circuit as claimed in claim 4 wherein said controller is operable in a third mode to operate said switches in a sequence of states so as to generate, in use with said plurality of flying capacitors connected to said flying capacitor nodes, first and second output voltages at said first and second output nodes respectively wherein said first and second output voltages are of opposite polarity to one another and each substantially equal in magnitude to a rational fraction of said input voltage and wherein the output voltages in said third mode are different to the output voltages in said first or second modes.

6. A charge pump circuit as claimed in claim 2 wherein said controller comprises a control input and operates in said first mode or said second mode based on a control signal received at said control input.

7. An audio amplifier circuit comprising:
one or more amplification stages; and
a charge pump circuit as claimed in claim 1 wherein said first and second output voltages are provided as power supplies for at least one of said one or more amplification stages.

8. An audio amplifier circuit comprising:
one or more amplification stages; and
a charge pump circuit as claimed in claim 6 wherein said first and second output voltages are provided as power supplies for at least one of said one or more amplification stages;
wherein said control signal is a volume control signal.

9. An audio apparatus comprising an audio amplifier circuit as claimed in claim 7.

10. An audio apparatus as claimed in claim 9 wherein the audio apparatus comprises at least one: a portable music system, an MP3 player, a mobile telephone handset, a Hi-Fi, an in-car entertainment system and a DVD player.

11. A charge pump circuit comprising:
an input node for receiving an input voltage;
a first reservoir capacitor connected to a first output;
a second reservoir capacitor connected to a second output;
a single flying capacitor;
a switch network for interconnecting said input node, said flying capacitor and said first and second reservoir capacitors; and
a controller for operating said switches, said controller being operable in a first mode to operate said switches in a sequence of states so as to generate first and second output voltages at said first and second outputs, respectively, wherein said first and second output voltages are of opposite polarity to one another and each is substantially equal in magnitude to half of said input voltage.

12. A charge pump circuit as claimed in claim 11 wherein said controller is operable in a second mode to operate said switches in a sequence of states so as to generate first and second output voltages at said first and second outputs respectively wherein said first and second output voltages are of opposite polarity to one another and each substantially equal in magnitude to said input voltage.

13. An audio amplifier circuit comprising:
one or more amplification stages; and
a charge pump circuit as claimed in claim 11 wherein said first and second output voltages are provided as power supplies for at least one of said one or more amplification stages.

14. An audio amplifier circuit comprising:
one or more amplification stages; and
a charge pump circuit as claimed in claim 12 wherein said first and second output voltages are provided as power supplies for at least one of said one or more amplification stages;
and wherein said charge pump operates in said first mode or said second mode based on a control signal.

15. A charge pump circuit as claimed in claim 1, further comprising a single flying capacitor connected between two of said plurality of flying capacitor nodes.

* * * * *